(12) United States Patent
Shukla

(10) Patent No.: US 11,295,929 B2
(45) Date of Patent: Apr. 5, 2022

(54) SAMPLE HOLDER FOR ELECTRON MICROSCOPY

(71) Applicant: ZoNexus LLC, Pinole, CA (US)

(72) Inventor: Alpesh Khushalchand Shukla, Pinole, CA (US)

(*) Notice: Subject to any disclaimer, the term of this patent is extended or adjusted under 35 U.S.C. 154(b) by 0 days.

(21) Appl. No.: 16/944,908

(22) Filed: Jul. 31, 2020

(65) Prior Publication Data
US 2021/0350998 A1 Nov. 11, 2021

Related U.S. Application Data

(60) Provisional application No. 62/881,877, filed on Aug. 1, 2019.

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/20207* (2013.01)

(58) Field of Classification Search
CPC .... H01J 37/20; H01J 37/26; H01J 2237/2003; H01J 2237/2007; H01J 2237/2008; H01J 2237/206; H01J 2237/2062; H01J 2237/20207
See application file for complete search history.

(56) References Cited

U.S. PATENT DOCUMENTS 8,569,714 B2 * 10/2013 Han ................... H01J 37/20
250/440.11

* cited by examiner

*Primary Examiner* — David E Smith
*Assistant Examiner* — Hsien C Tsai
(74) *Attorney, Agent, or Firm* — Intellent Patents LLC; Ahmed Alhafidh

(57) ABSTRACT

A sample holder tip for use in transmission electron microscopy (TEM) or scanning electron microscopy (SEM) for performing in-situ experiments is described which facilitates in situ analysis of air-sensitive samples and allows physical manipulation of the sample. This includes, but is not limited to translation, rotation, electrical biasing, and heating/cooling for one or more individual cradles. The sample holder tip incorporates a compact design which eases sample loading and enables direct linkages between consecutive cradles, allowing a single tilt actuator to rotate each cradle around its respective eucentric position. Each of the connecting wires incorporates one or more bends or kinks which enable conductive access to the sample holder tip while also preserving the ability to also retract/extend the tip and tilt individual cradles with at least two degrees of freedom.

8 Claims, 23 Drawing Sheets

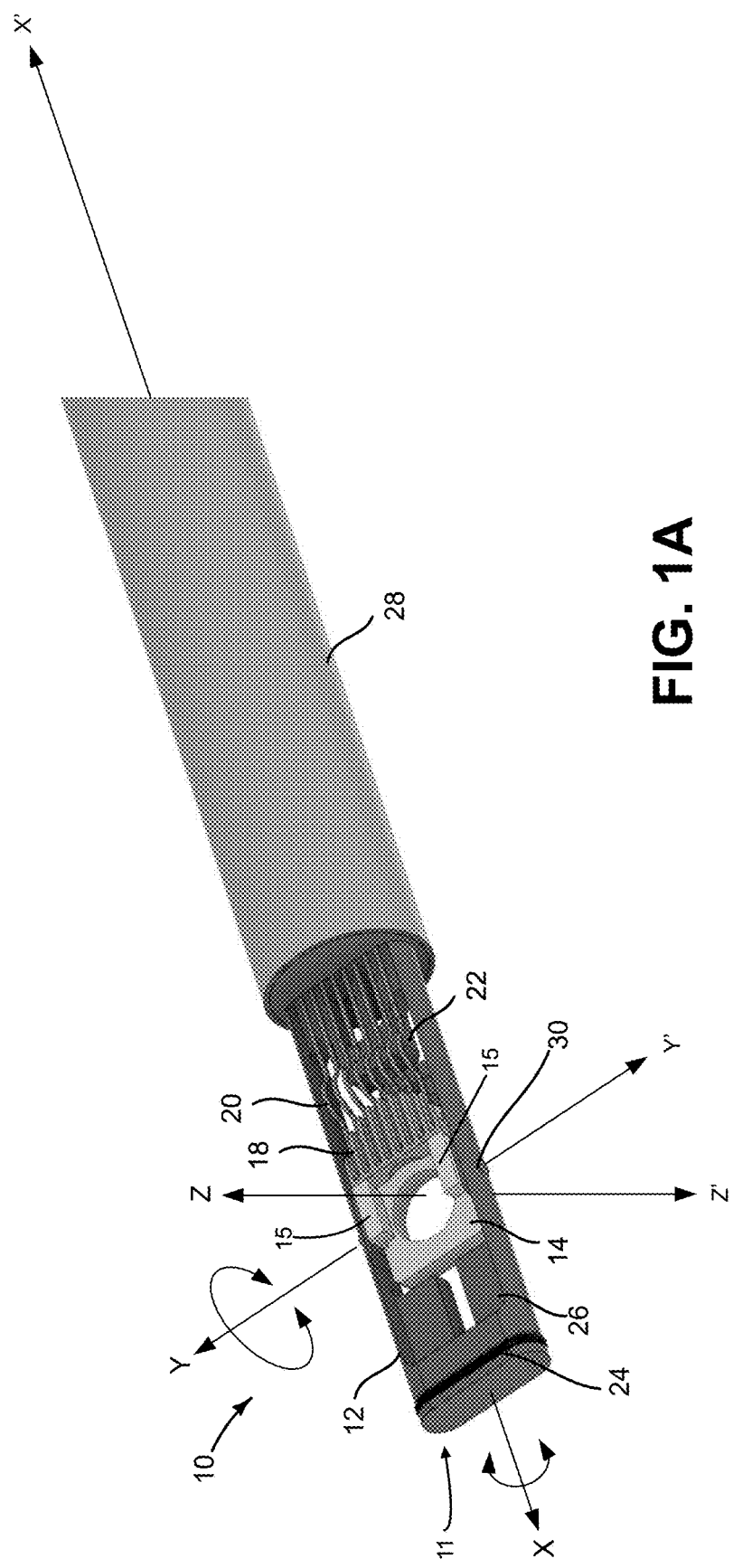

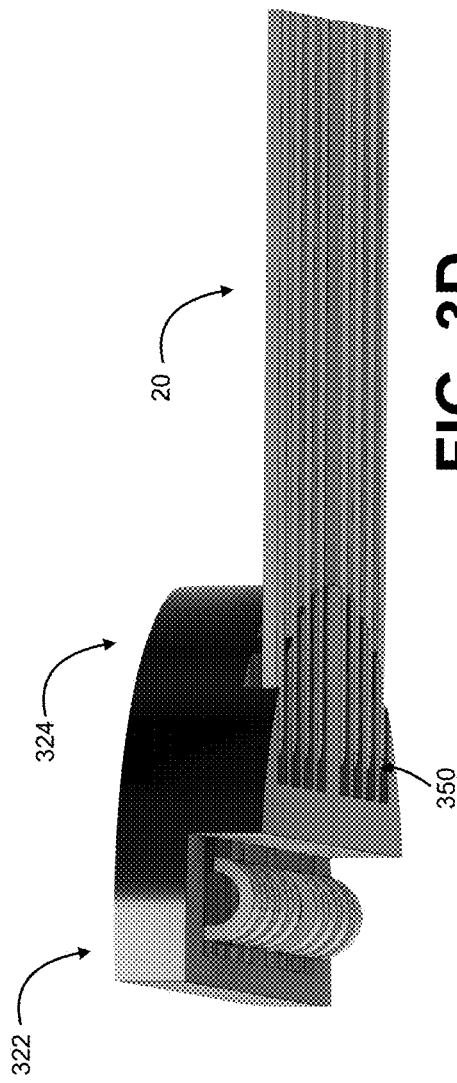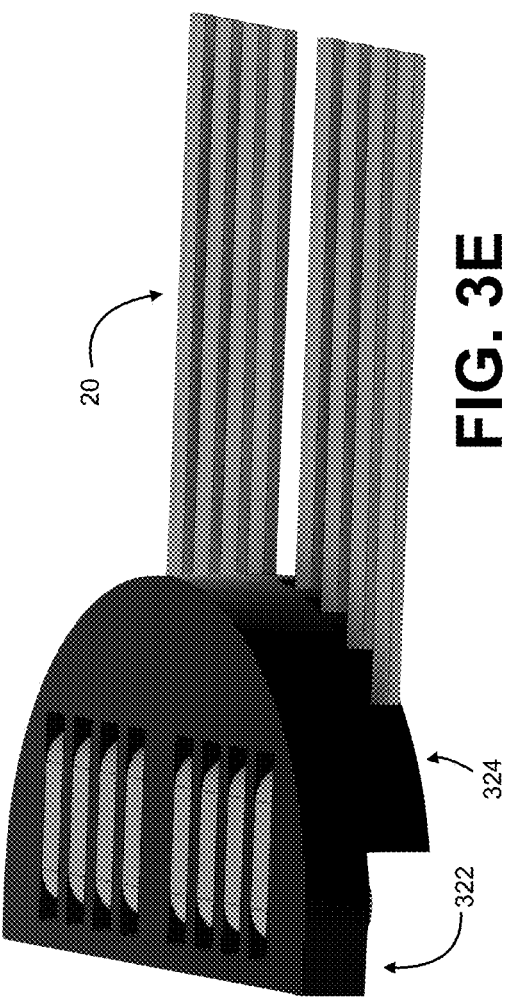

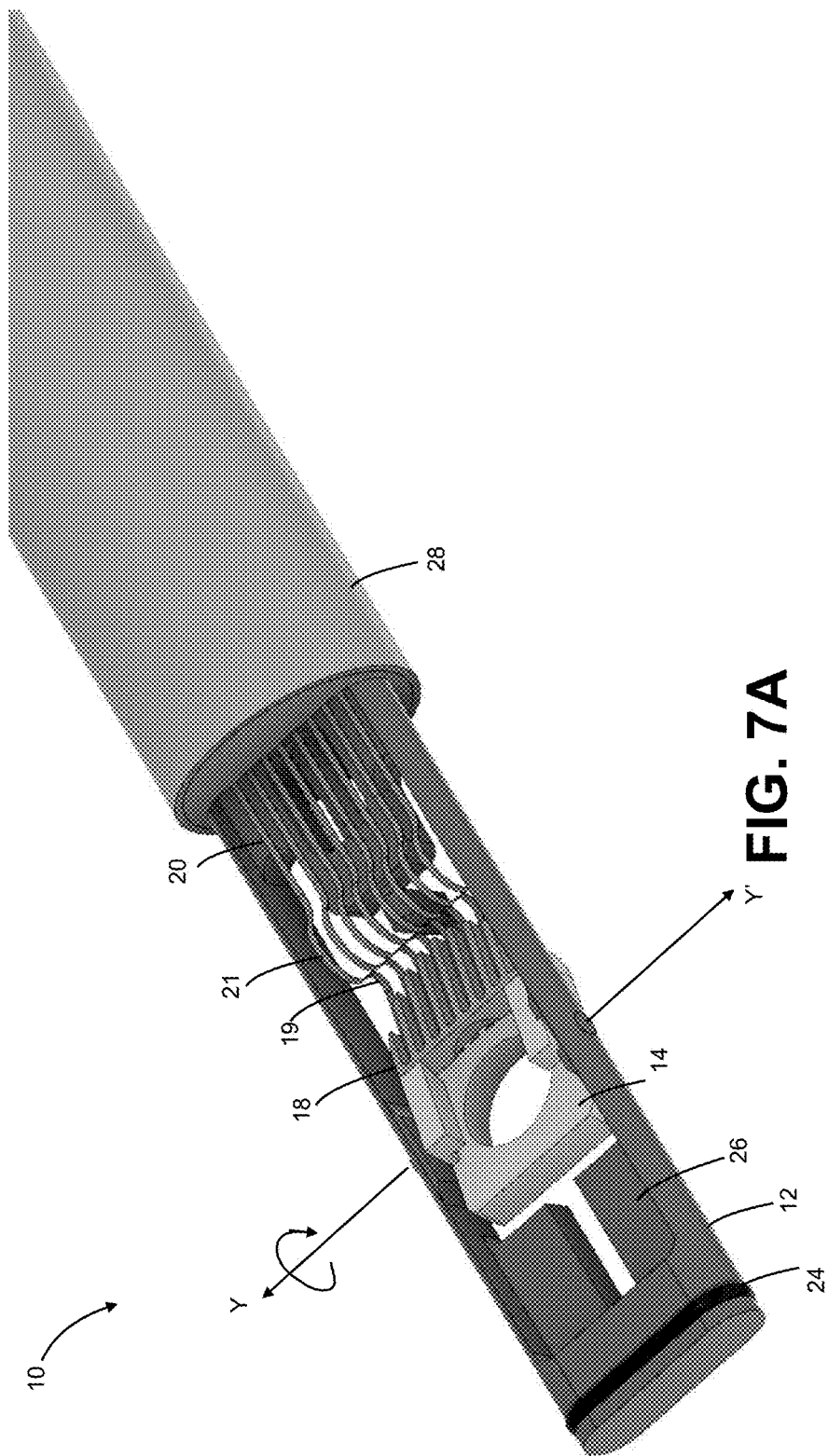

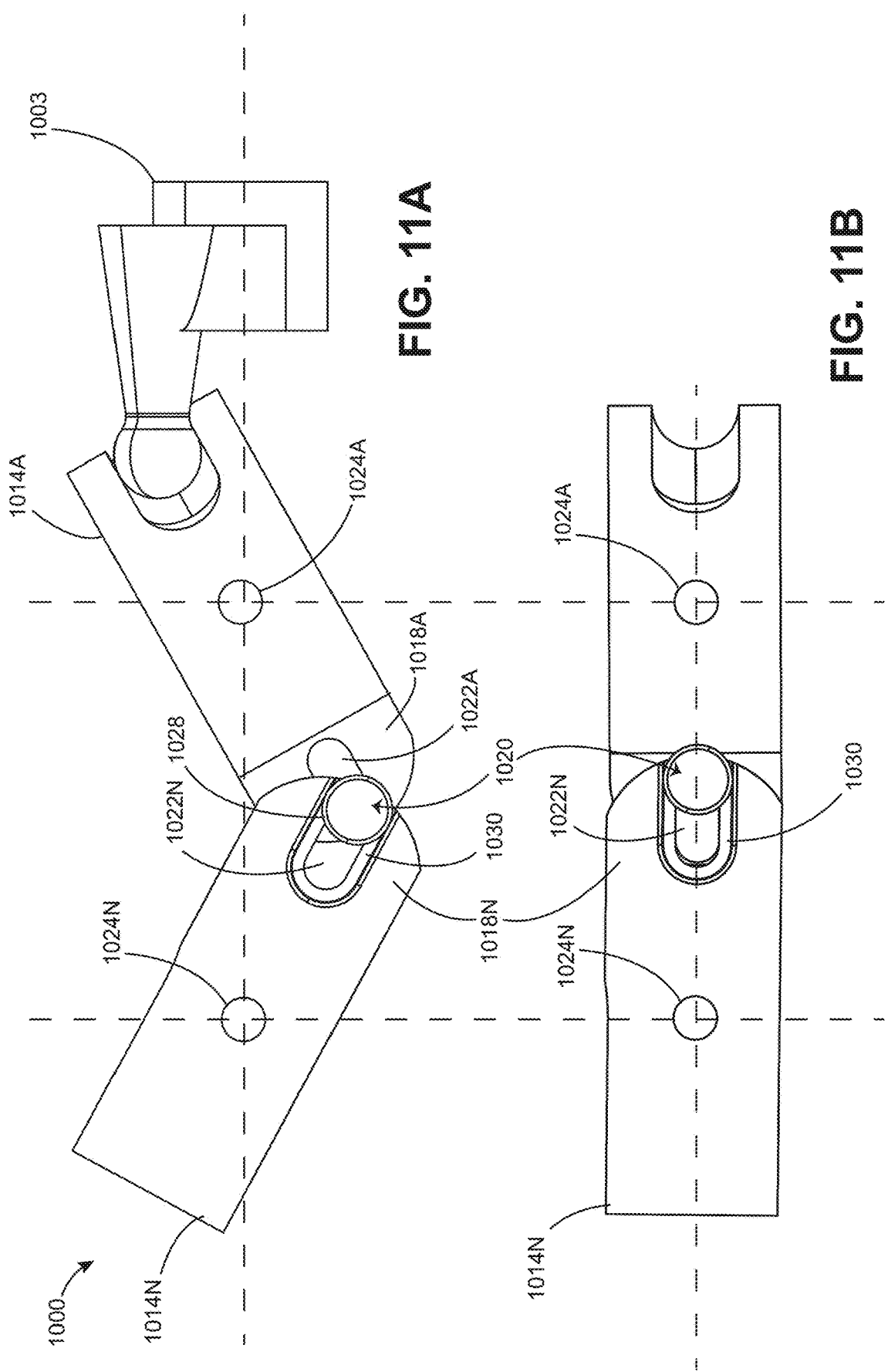

SAMPLE HOLDER FOR ELECTRON MICROSCOPY

CLAIM OF PRIORITY

This application claims priority to U.S. Provisional Patent Application No. 62/881,877 filed Aug. 1, 2019, the entire disclosure of which is hereby expressly incorporated by reference.

FIELD OF TECHNOLOGY

The present description relates generally to sample holders for performing in-situ experiments using electron microscopy, particularly transmission electron microscopy (TEM) and scanning electron microscopy (SEM).

BACKGROUND

Transmission Electron Microscopy (TEM) is a high-resolution imaging technique used for systematic study of internal structures/defects in various materials, compositions, and probing structural changes at an atomic scale. In general, TEM involves transmitting a beam of electrons through a sample under study, and observing an image captured as a result of interaction between the electrons and the sample being studied. An example application for TEM is in the area of battery development. For example, TEM can be used to study solid electrolyte interfaces in solid-state battery systems, such as lithium metal or lithium-sulfur based systems. Specifically, in situ Transmission Electron Microscopy (in situ TEM), wherein a sample material is subjected to a treatment or stimulation, such as electrical biasing or mechanical stimulation, for example, and the corresponding response or change is observed under the TEM, can provide insights into the challenges faced in the development of advanced solid-state battery systems.

A TEM system includes a sample holder, which provides support for positioning the sample in the electron path within a column of the TEM system. For in situ TEM investigations, the sample holder can be used to provide one or more desired treatments or stimulations, such as electrical, mechanical, or thermal signals, to the sample under investigation. An example in situ holder is shown by Damiano, Jr. et al. in U.S. Pat. No. 9,437,393 (Hereinafter the '393 patent). Therein, an electrical connector includes a support end comprising an electrical contact pad and a barrel end with one or more barrel contact points for connection to wires within a barrel of the sample holder. The barrel end of the electrical connector is inserted into the barrel while the electrical contact pad is in contact with the holder body. During sample holder assembly, a sample support device comprising sample support pads is loaded onto the holder body having the electrical contact pad. Electrical connections are formed between the sample support pads and the electrical contact pad when a holder lid is positioned and secured on top of the holder body.

However, the '393 has numerous issues. For example, the electrical connector in the '393 patent does not allow tilting of the sample and restricts addition of any tilting movement about the Y-axis due to its flat linear configuration and rigid connection between the sample holder body and the barrel. Further, due to lack of a retraction mechanism, the sample holder described in the '393 patent cannot be used for preparing air-sensitive samples which need to be prepared and transferred in a sealed environment, such as vacuum or inert gas environment. Furthermore, the '393 patent requires the sample support device and the holder lid to be placed over the sample holder body and secured with a fastener in order to establish electrical contacts. Such an arrangement makes the sample holder bulky and thus incompatible with any retraction mechanism. Further still, positioning all the components, including the sample, the sample support device, and the lid on the sample holder and securing with a fastener renders the sample preparation tedious for a user, particularly, when preparing samples within a glove box where the user loses dexterity with the use of thick gloves.

Han et al. disclose another example in situ sample holder in U.S. Pat. No. 8,569,714 (Hereinafter the '714 patent). Therein, a double tilt sample holder that allows the sample to be rotated along an X-axis (longitudinal axis of the sample holder) and tilted along a Y-axis (herein referred to as beta tilt), where the Y-axis is perpendicular to X-axis, while performing in situ study under TEM is disclosed.

However, the inventor herein has identified potential issues with the double tilt in situ holder in the '714 patent. For example, the connections between the conductor wires and an electrode array distributed along the sides of the sample holder and an electrode interface may break with repeated tilting of the sample holder, thus rendering the holder unsuitable for in situ experiments. Further, as the double tilt in situ holder provides electrical connections via the electrodes distributed on the sides of the holder, it requires a large frame to accommodate the electrodes and electrical connections. Furthermore, the double tilt in situ holder cannot be used for air-sensitive samples due to the lack of a retraction mechanism. Specifically, due to the large frame design of the in situ holder, incorporating a retraction mechanism within the double tilt in situ holder may not be possible considering the requirement for a holder tip with a small width in certain microscopes.

An example retractable sample holder is shown by Stabacinskiene et al. in U.S. Pat. No. 9,010,202 (Hereinafter the '202 patent). Therein, a cryogenic specimen holder is disclosed that has a retractable tip that when retracted shields the specimen within the specimen holder body. However, the inventor herein has identified that the cryogenic specimen holder cannot used for in situ experiments, such as electrical biasing, due to lack of ability to accommodate electrical connections. Furthermore, the cryogenic holder does not provide a double tilt mechanism, and incorporating a double tilt mechanism in the cryogenic holder would render the holder tip bulky, which would in turn hinder the retraction mechanism.

Furthermore, there is a limited availability and variety of sample holders which accommodate multiple samples, and no contemporary mechanisms which allow each of a plurality of samples to be tilted. Allowing multiple samples to be rigorously tested allows for high throughput characterization, which is in high demand in physical sciences where typically a side entry holder only allows one sample at a time to be analyzed. Very few examples exist, such as Gatan model 677 and Gatan model 910, that allow rotation of multiple samples, and rotation is typically limited to one axis openly (e.g., alpha tilt). However, it is vital to enable at least two-axis tilt in order, for example, to align crystalline samples to certain crystallographic directions (called zone axes).

An example of double tilt device can be found in *Transmission Electron Microscopy Part 1: Basics* (Page 135, Williams, D. B. & Carter, C. B.; Springer Verlag, 2009), in which two tilted cradles are shown within the same sample holder. The mechanism for propagating tilt from a first actuated cradle to a second is presumed to be incorporated in the housing. However, this invariably requires that the housing be large enough to accommodate the added mechanical complexity. Additionally, the partition between the cradles is wasted space which adds to overall bulk. This may not have been an issue with legacy TEMs which could accommodate large holders, but modern TEM environments necessitate a small holder tip form factor, especially if retraction/extension, biasing, and other manipulations are still desired in air-free environments. As such, the double-tilting holder tip shown in Williams would not be reliable using contemporary TEMs—furthermore, the tilting mechanism cannot be expected to scale up to more than two cradles at least because of the crowdedness of the design shown.

Taken together, previous sample holders that allow preparation and transfer of samples in a vacuum or inert gas environment (also referred to as air-free or vacuum transfer holders) do not include connecting wires for electrical biasing, heating, etc., and thus cannot be employed for in situ experiments. Additionally, loading the sample on to the vacuum transfer holders involves the use of small parts, such as screws, hex rings etc., that are difficult to use in a glove box during sample preparation. Especially when a sample is loaded, unloading the deployed sample is difficult due to the lack of proper ergonomics and poor stage design; furthermore, unloading can comprise the sample or the environmental conditions therearound. Further, some biasing holders for in situ TEM studies do not have double tilt or air-free transfer capability, and some other biasing in situ TEM holders that allow limited double tilt (no more than 20 degrees) of the sample holder have fragile connections and thus, after repeated tilting motions, results in fatigue and breakage of the connections. Further, the mechanisms for double tilt in situ TEM holders are too bulky to allow air-free transfer capability.

Thus, previous sample holders, as discussed above, due to lack of one or more of durable connections for in situ experiments, double tilt capability, multi-cradle accommodation and air-free transfer capability, or larger holder design, cannot be used for in situ investigation of air-sensitive samples, such as studying solid state battery materials.

SUMMARY

In one example, the above issues may be addressed by a sample holder tip for transmission electron microscopy, comprising: a frame, a cradle rotatably coupled to the frame and comprising a sample stage, and a connector assembly coupled to the cradle. The connector assembly includes a connector support element, a plurality of connecting wires, and a tilt actuator coupled to the cradle for tilting the cradle. The connector support element has a first portion positioned in relation to the sample stage so as to accommodate a portion of a prepared sample. The connector support element also has a second portion which rests against the sample stage. Each of the connecting wires comprises one or more bends.

Furthermore, the sample holder tip may include a retraction barrel portion including a retraction shaft coupled to a shaft of the tilt actuator. The cradle may further include a tilt actuator support portion through which the tilt actuator shaft extends. The tilt actuator may be coupled to the cradle via a linkage which converts a rotational motion of the retraction shaft to a tilt motion of the cradle.

Additionally, the sample holder tip may additionally include an internal connector receiving a first end of the plurality of connecting wires. The connector support element may comprise a plurality of parallel channels corresponding to the plurality of connecting wires. Each channel may be formed by a groove running from the second portion to the first portion and adjacent to at least one ridge. Each channel of the plurality of channels comprises an opening over the sample stage in the first portion. A second end of each of the plurality of connecting wires extends through the corresponding openings of the plurality of channels.

In this way, by configuring the connecting wires with one or more bends and kinks, the sample holder may be used to provide double tilt while maintaining connections for in situ investigations. The connecting wire with one or more bend and kinks also allows for a compact holder design. Thus, the sample holder can be used with a retraction mechanism, thereby allowing preparation and transport of air-sensitive samples. By using connecting wires with one or more bend and kinks, a sample holder that provides beta tilt and connections for in situ studies maintains connections while maintaining beta tilt, and provides retraction capabilities for air-free sample preparation and transfer.

As an example, a sample holder tip for in situ investigation of air-sensitive samples includes an outer frame within which a cradle is movably coupled via a pivot joint to allow titling of the cradle in a Y-direction perpendicular to the longitudinal axis of the sample holder (beta tilt). The cradle may further include a sample stage for positioning the sample and a pair of guides on opposite sides of the cradle for guiding the sample during loading of the sample onto the holder. The cradle is coupled to a tilt mechanism via a linkage at one end for tilting the cradle in the Y-direction. A connector assembly, including a connector support element and a plurality of connecting wires, is positioned over a top surface of a portion of the cradle and coupled to each of the pair of guides on the cradle. Each of the plurality of connecting wires include a first outward convex bend (bulging downward from a bottom surface of the connector support element). When positioned over the cradle, a gap is provided between a trough of the first bend of each of the plurality of connecting wires and a top surface of the cradle. During sample loading, a user may position the sample onto the platform and slide the sample through the pair of guides and below the first bend of each of the plurality of connecting wires. When the sample loading is completed, each of the plurality of connecting wires is in direct contact with the sample at the first bend.

In this way, the bends in the plurality of connecting wires not only provide physical connection between the connecting wires and the sample, they also serve to secure the sample on to the sample stage along with the pair of guides. Further, the plurality of connecting wires may be made with materials having high spring constant, and thus, due to the spring action, the sample holder can accommodate samples of varying thickness. Additionally, as the sample is loaded by sliding under the pair of guides and secured by the contact between the sample and the connecting wires, user-friendliness of installing the sample is increased.

Further, following the first bend, each of the plurality of connecting wires traverse along corresponding channels in the connector support element and exit the connecting support element at the end where the cradle is connected to the tilt actuator mechanism. Thus, in order to reduce interference with the tilt actuation mechanism that provides beta tilt for the cradle, one or more additional kinks and bends are included in each of the plurality of connecting wires. Specifically, the one or more additional kinks and bends may include an upward convex bend in the connecting wire that is positioned above the tilt mechanism. A curvature radius of the upward convex bend may be based on a size of the tilt actuation mechanism, and may extend over and separated from the tilt actuation mechanism at all angles of beta tilt.

In this way, the one or more additional kinks and bends allow the plurality of the connecting wires allow to be positioned over the tilt mechanism, which reduces the need to increase frame size to accommodate the connecting wires. The reduced frame size and hence, compact configuration of the sample holder allows the sample holder tip to be retracted into a retraction barrel of the sample holder, which in turn allows handling of air-sensitive samples, such as solid-state battery materials. Further, the one or more additional kinks and bends allow the tilt actuator mechanism to tilt the stage to a greater degree without resulting in fatigue. Thus, the one or more additional kinks and bends in each of the plurality of the connecting wires allow the connections to be maintained while providing a high degree of beta tilt of the sample stage.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 1A shows a top perspective view of a sample holder tip according to the present invention.

FIG. 3D shows a bottom perspective view of a second embodiment of a connector support element and a plurality of connecting wires of a connector assembly of the sample holder of FIG. 1A.

FIG. 3E shows a top perspective view of a second embodiment of a connector support element and a plurality of connecting wires of a connector assembly of the sample holder of FIG. 1A.

FIG. 7A shows a second top perspective of the sample holder tip of FIG. 1A with the cradle, the connector assembly, and the tilt actuator in a beta tilt position.

FIGS. 11A and 11B show side views of cradles in a tilted position and in a horizontal position, respectively.

DETAILED DESCRIPTION

Figure 7B:
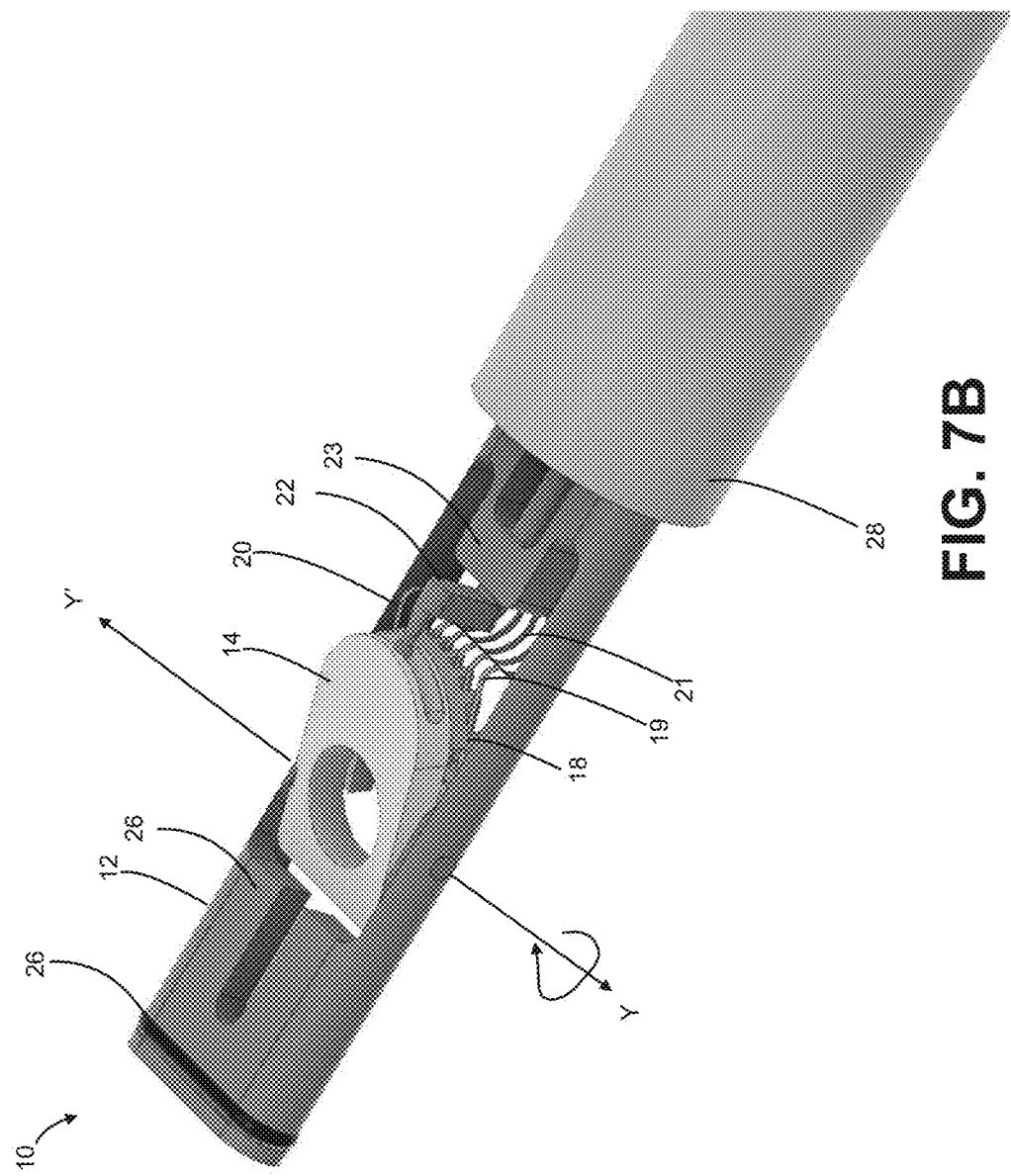
FIG. 7B shows a second bottom perspective of the sample holder tip of FIG. 1A with the cradle, the connector assembly, and the tilt actuator in the beta tilt position.
Figure 8A:
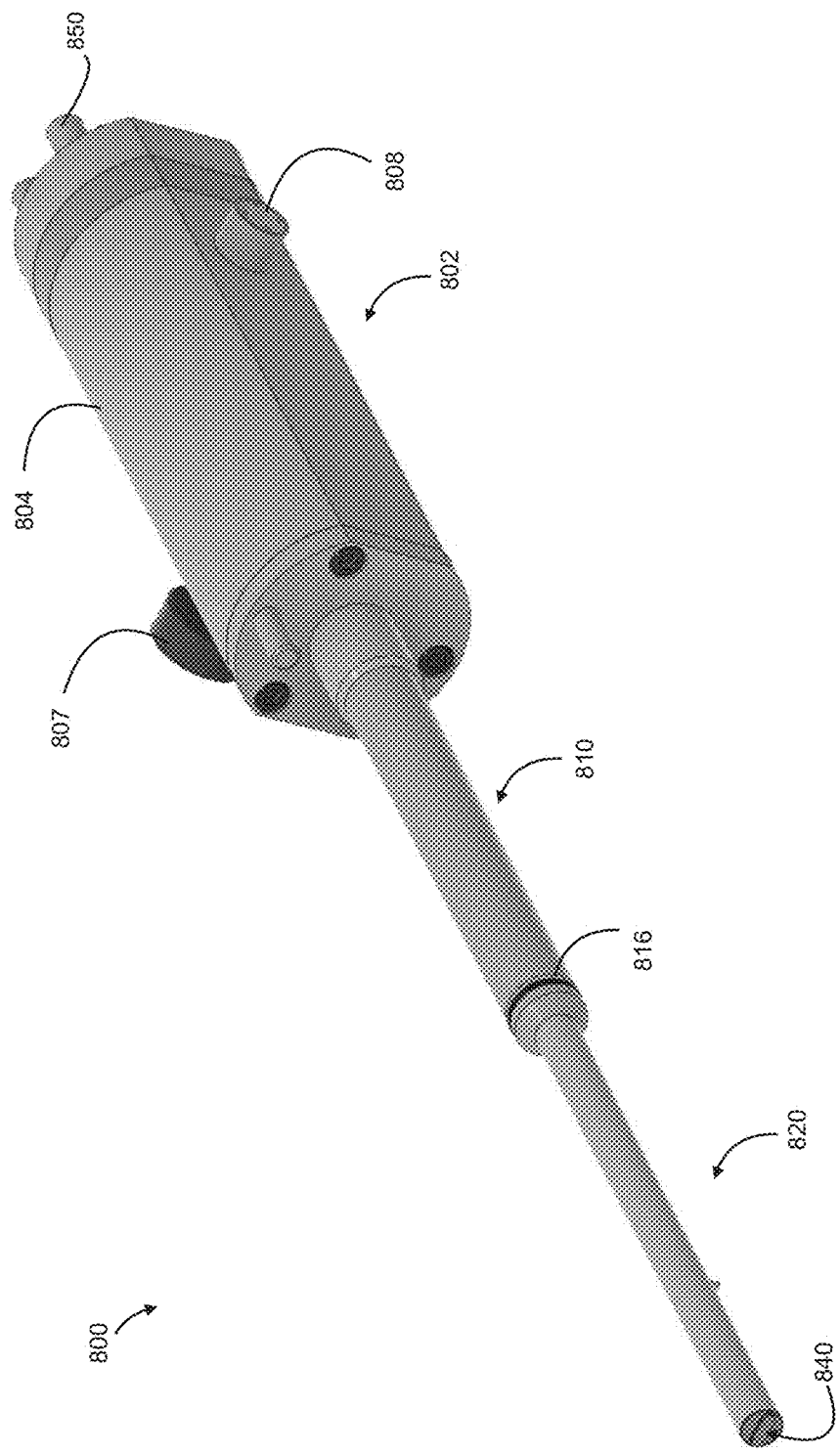
FIG. 8A shows a perspective view of a sample holder assembly including the sample holder tip shown in FIG. 1A in a retracted position.
Figure 8B:
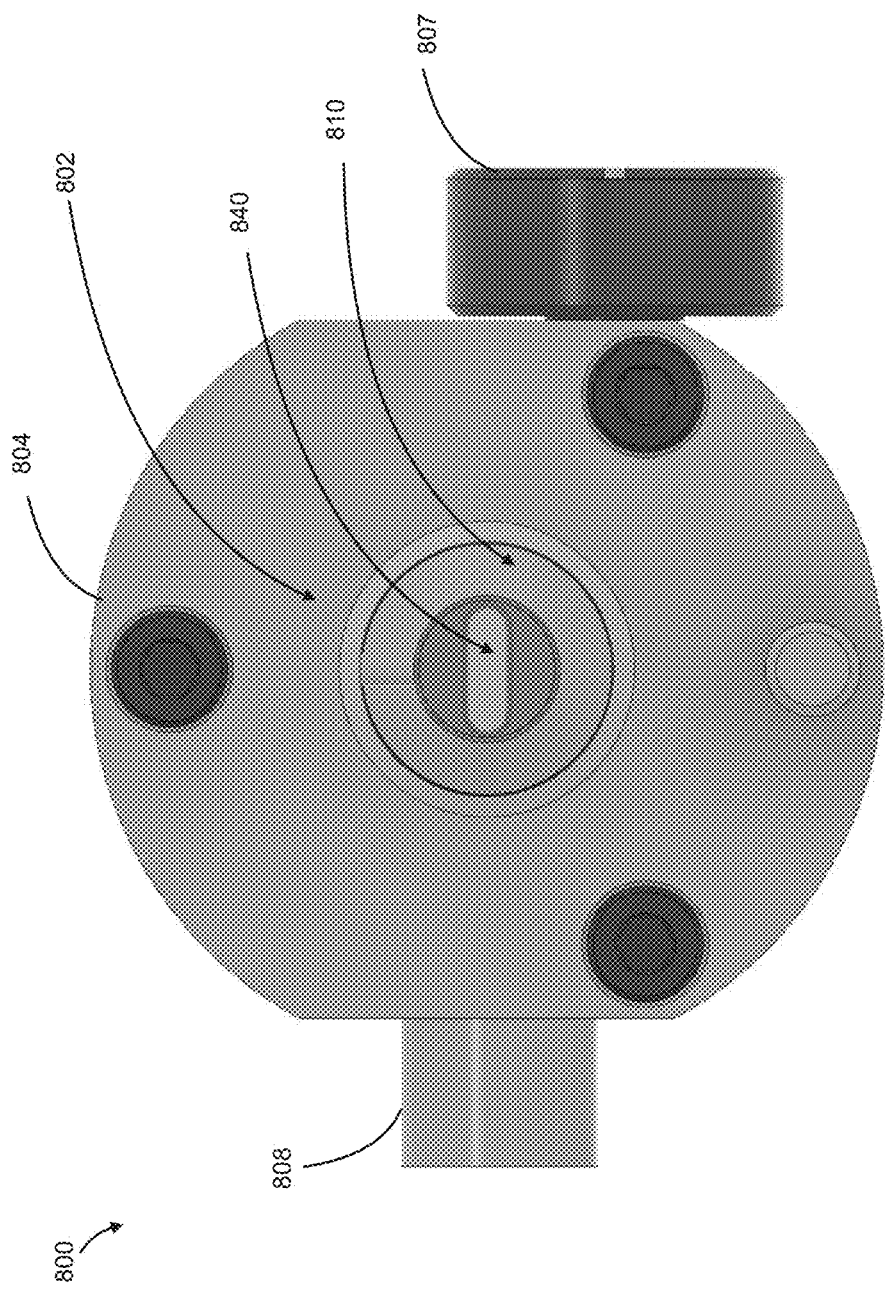
FIG. 8B shows a front view of the sample holder assembly of FIG. 8A with the sample holder tip in the retracted position.

The present description is related to sample holders for in situ transmission electron microscopy (TEM), particularly for in situ TEM analysis of air-sensitive samples. A sample holder assembly, such as sample holder assembly at FIGS. 8C and 8D, may include a sample holder tip, such as sample holder tip shown at FIGS. 1A-1E, and 2. The sample holder tip may include a connector assembly, such as connector assembly shown in FIGS. 3A and 3B, for providing in situ signals during investigation under TEM via a plurality of connecting wires. Further, the connector assembly may be configured to secure the sample on the sample stage while providing connections for in situ investigations. Furthermore, the connector assembly may be coupled to a beta tilt actuator, such as beta tilt actuator shown in FIGS. 5 and 6 to provide a beta tilt angle during in situ studies. Particularly, the plurality of connecting wires may be configured with one or more bends and kinks such that the plurality of connecting wires in addition to holding the sample on the sample stage and providing connections for in situ signals, due to the one or more bend and kinks, a greater degree of beta tilt is accomplished. An example beta tilt of the sample holder tip is shown at FIGS. 7A and 7B. Further still, the one or more bends and kinks allow the plurality of connecting wires to be positioned over the tilt actuator of the tip without interfering with the tilting function. As a result, a bulkiness of the frame and hence, the tip is reduced, which in turn allows the sample holder tip to be fitted with a retraction mechanism. The retraction mechanism allows the sample holder tip to be retracted in to a retraction barrel and sealed in an air-free or inert gas environment during sample preparation and transfer of air sensitive samples. The retracted position of the sample holder is shown in FIGS. 8A-8B. In this way, an in situ sample holder for TEM with double tilt mechanism and retraction mechanism for air-sensitive samples in provided.

Figure 1B:
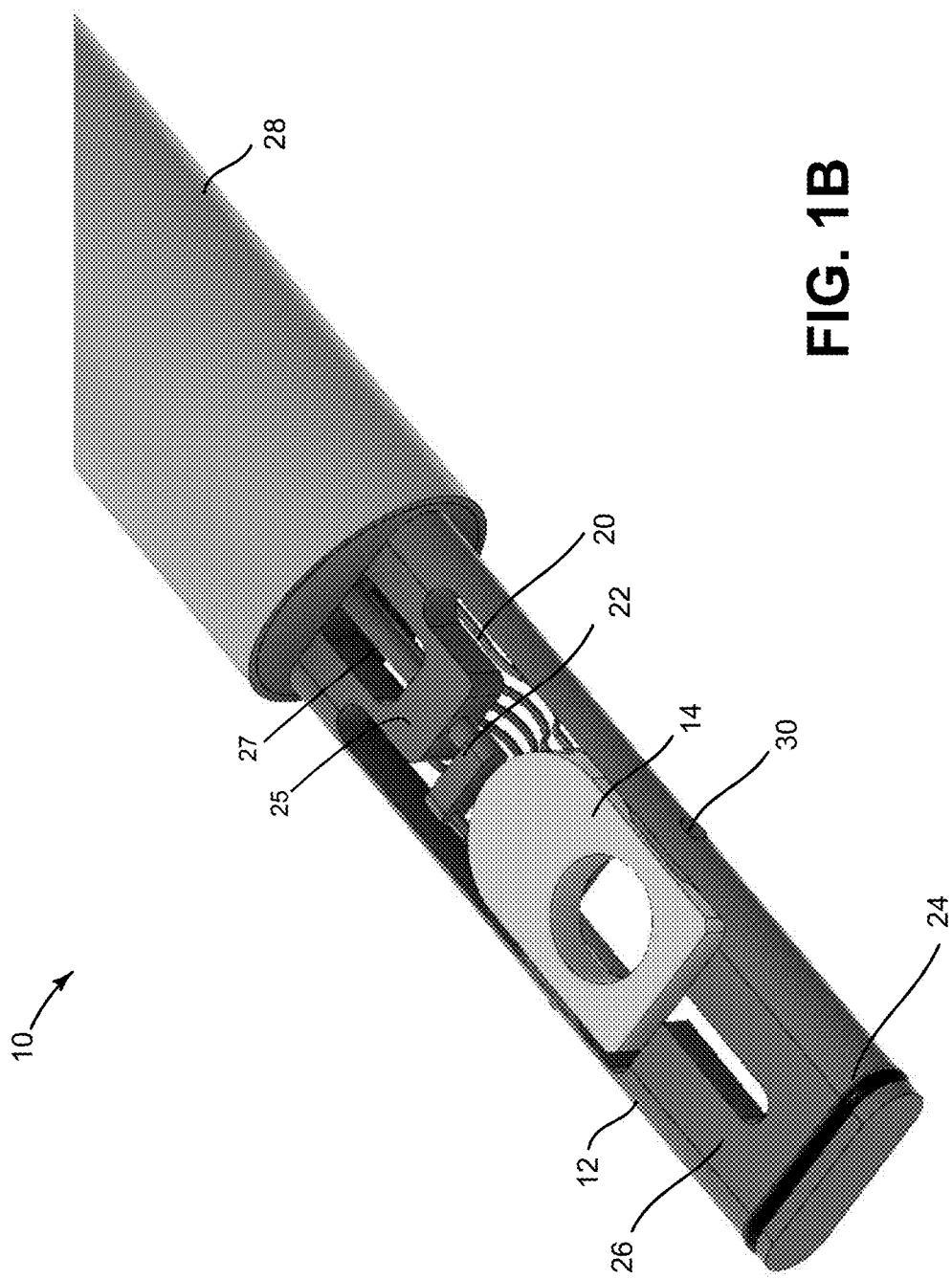
FIG. 1B shows a bottom perspective view of the sample holder tip of FIG. 1A.
Figure 1C:
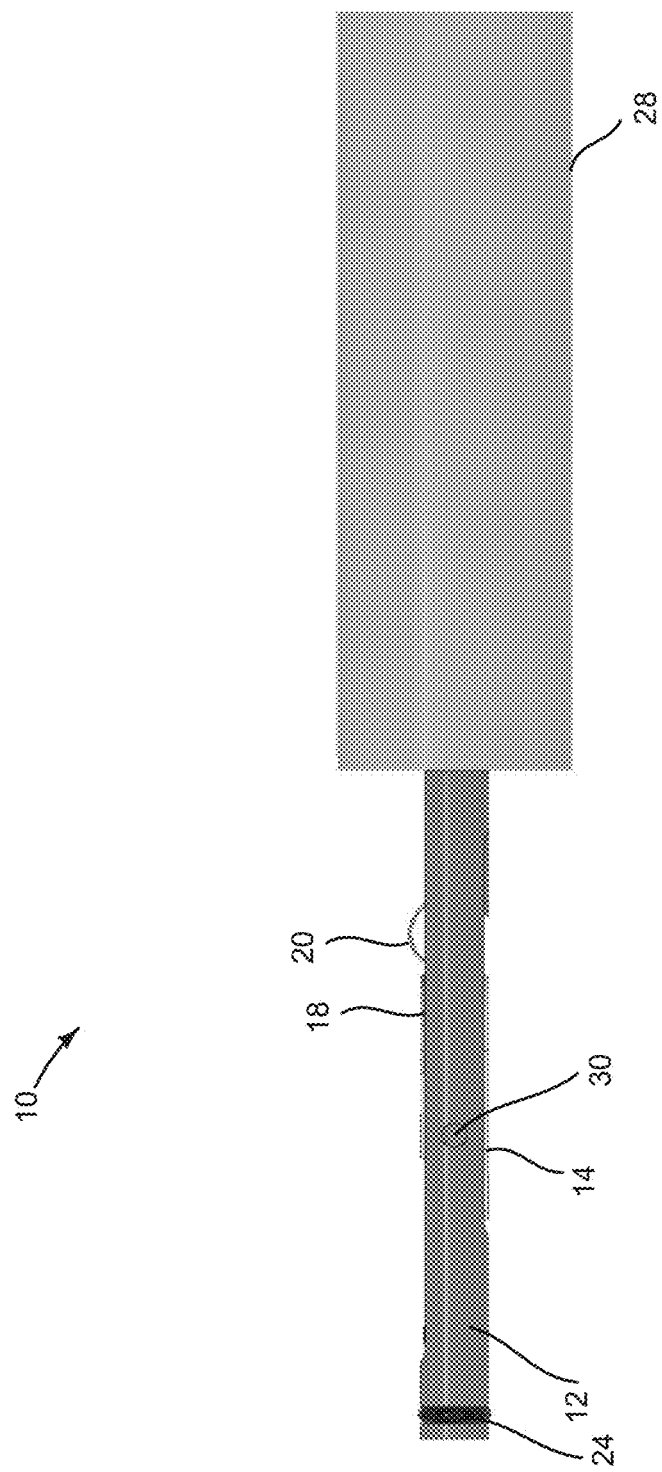
FIG. 1C shows a side view of the sample holder tip of FIG. 1A.

Turning to FIGS. 1A-1C, different views of a sample holder tip 10, which is a distal end portion of a sample holder assembly that is used in conjunction with a transmission electron microscope (TEM), are illustrated. The sample holder assembly may be a side entry sample holder for positioning and holding a sample within the microscope, and providing an interface between a high-vacuum environment of the TEM and an outside environment. Further, the sample holder assembly may be capable of rotation along a longitudinal axis of sample holder assembly, providing a tilting motion for a sample stage along a second axis perpendicular to the longitudinal axis, and providing retraction and extension of sample holder tip 10. Movements of sample holder tip 10 are illustrated in FIG. 1A, and the axes and movements of the sample holder are defined below. An example side entry sample holder assembly is described with respect to FIGS. 8A-8D below.

X-axis (indicated as X-X' in FIG. 1A) is defined as the longitudinal axis of the specimen holder. The sample holder tip may be rotated about the X-axis in a clockwise or an anti-clockwise direction. Further, horizontal movement of sample holder tip along the X-axis in a direction towards the distal end of the sample holder is defined as extension. Movement of the sample holder tip along the X-axis in a direction away from the distal end is defined as retraction. Y-axis (indicated as Y-Y' in FIG. 1A) is defined as the beta-tilt axis of the specimen holder assembly along the line of pivot joints between a frame 12 and a cradle 14 of sample holder tip 10. Y-axis is perpendicular to X-axis. Tilting of a distal end of the cradle in an upward direction about the Y-axis is defined as positive beta tilt, and tilting of the distal end of the cradle in a downward direction about the Y-axis is defined as negative beta tilt. Z-axis (indicated as Z-Z' in FIG. 1A) is defined as the vertical axis of the specimen holder, which is perpendicular to the X-axis and Y-axis.

Referring to FIG. 1A, frame 12 of sample holder tip 10 comprises a platform 26 near a distal end 11 of the tip for resting or parking the sample prior to mounting the sample on a sample stage. Adjacent to platform 26, frame 12 may include a pair of openings/slots (not shown), wherein each slot is positioned on either side of frame 12 for pivoting cradle 14. Further, frame 12 includes an O-ring 24 that is used to seal sample holder tip 10 when the sample holder tip 10 is retracted into a retraction barrel 28.

Cradle 14 includes a sample stage for mounting the sample, a base for positioning and attaching a connector assembly comprising a connector support element 18 and a plurality of connecting wires 20, and a pair of guides 15 on opposite sides of the sample stage for providing a pathway for inserting the sample and for securing the sample on to the sample stage. Details of cradle 14 will be further elaborated with respect to FIG. 5

Additionally referring to FIG. 1B, frame 12 further includes a tilt actuator support portion 25 that holds a drive shaft 27 of a beta-tilt actuator 22 (alternatively referred to herein as tilt actuator), wherein tilt actuator 22 is coupled to an end of cradle 14 away from platform 26 via a linkage, and wherein tilt actuator 22 enables tilting of cradle 15 about the Y-axis (beta tilt).

Figure 1D:
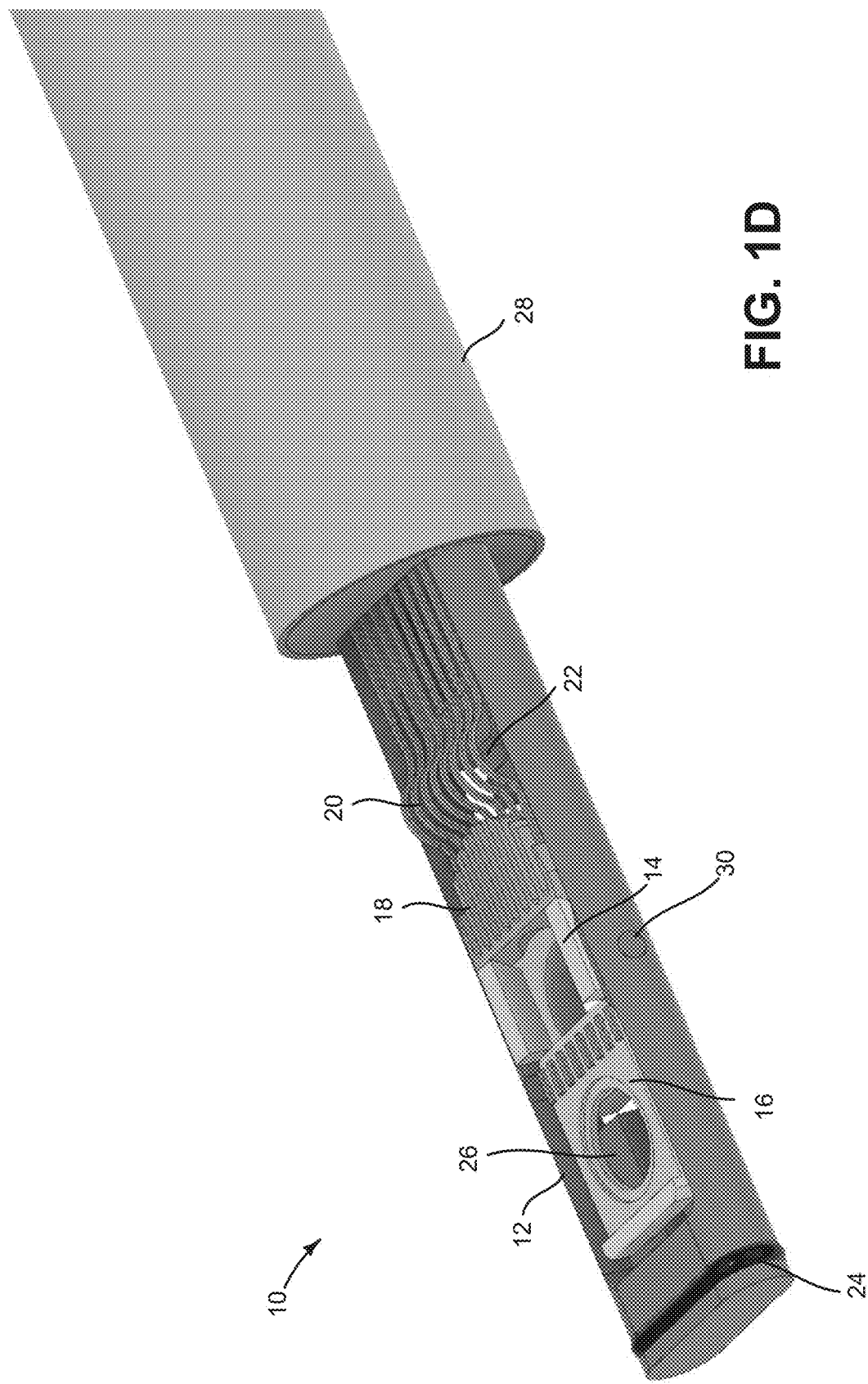
FIG. 1D shows a top perspective of the sample holder tip of FIG. 1A with a sample in a parked position.
Figure 1E:
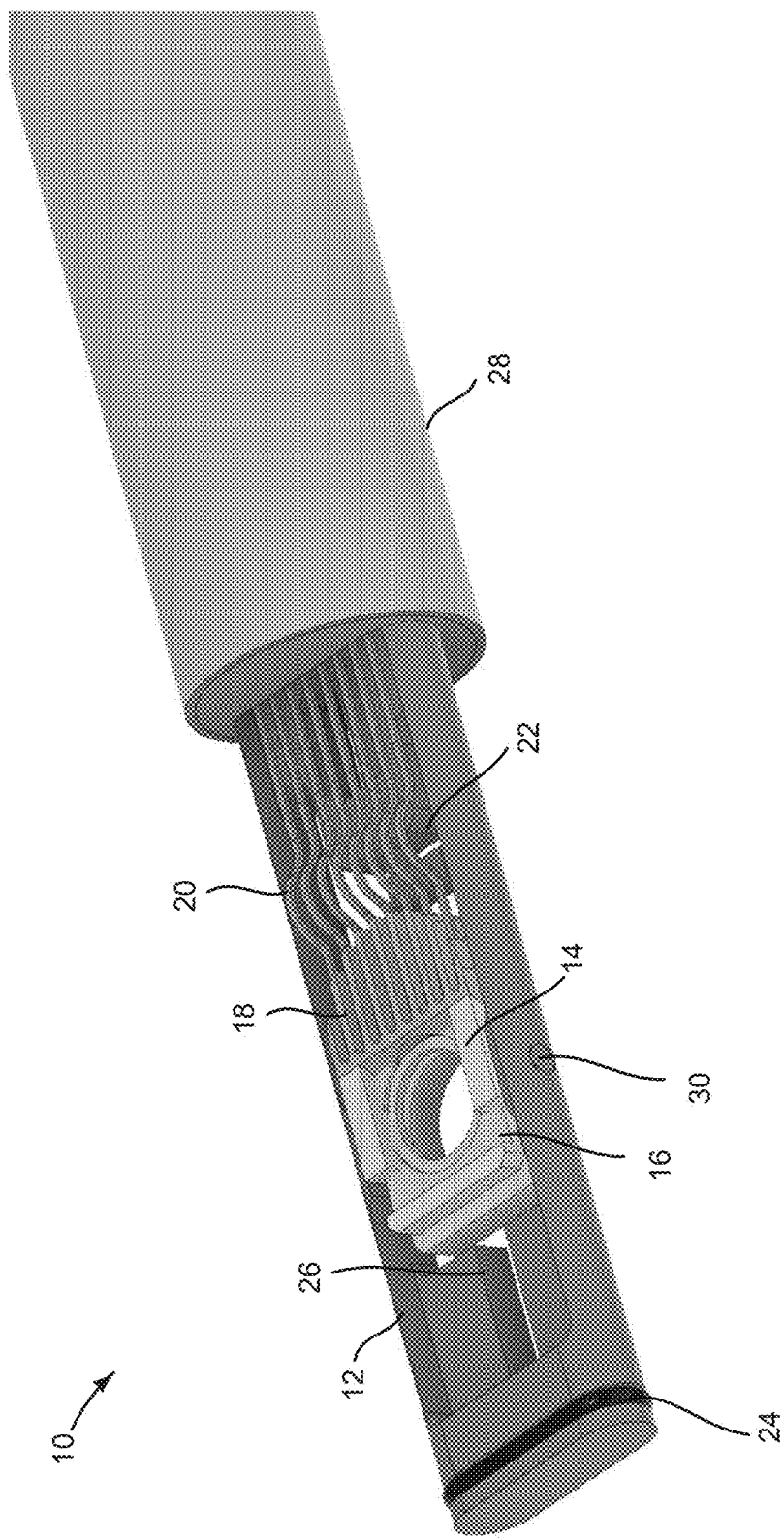
FIG. 1E shows a top perspective view of the sample holder of FIG. 1A with the sample in an inserted position.

During sample loading or exchange, the sample to be investigated under TEM may be positioned on platform 26. An example of sample tip 10 with a sample 16 in a parked/resting position on platform 26 is shown in FIG. 1D. Sample 16 may then be inserted through the openings/pathways provided by each of pair of guides 15 on cradle and subsequently pushed below the connector assembly. An example of the sample holder tip with sample 16 mounted on to the sample stage of cradle 14 is shown in FIG. 1E. A mounted sample 16 is positioned below the connector assembly and is held in place by the connector assembly and pair of guides 15, thus, eliminating the need for securing the sample with additional fasteners such as screws, hex rings, etc. Details of the connector assembly, including connector support element 18 and plurality of connecting wires 20, are elaborated with respect FIGS. 3A-3D, and 4. Briefly, each of the plurality of connecting wires 20 are positioned below a bottom surface of connector support element 18 near an edge that is coupled to cradle 14. Each of the plurality of connecting wires 20 includes a first bend that bulges downwards from the bottom surface of connector support element 18 forming a downward convex bend. During sample mounting, sample 16 is inserted below downward convex bends of each of the plurality of connecting wires and secured in place by spring action of each of the plurality of connecting wires, and thus, the samples do not require additional fasteners. This increases the ease of handling and greatly simplifies the sample loading for an end user. The ease of handling is particularly important when handling air-sensitive samples as they are prepared and mounted in an inert environment of a glove box where the user loses dexterity due to use of heavy gloves to reduce contamination. Thus, the connector assembly including connector support element 18 and plurality of connecting wires along with pair of guides 15 on cradle 14 allows the user to quickly mount the sample onto the sample stage.

Figure 2:
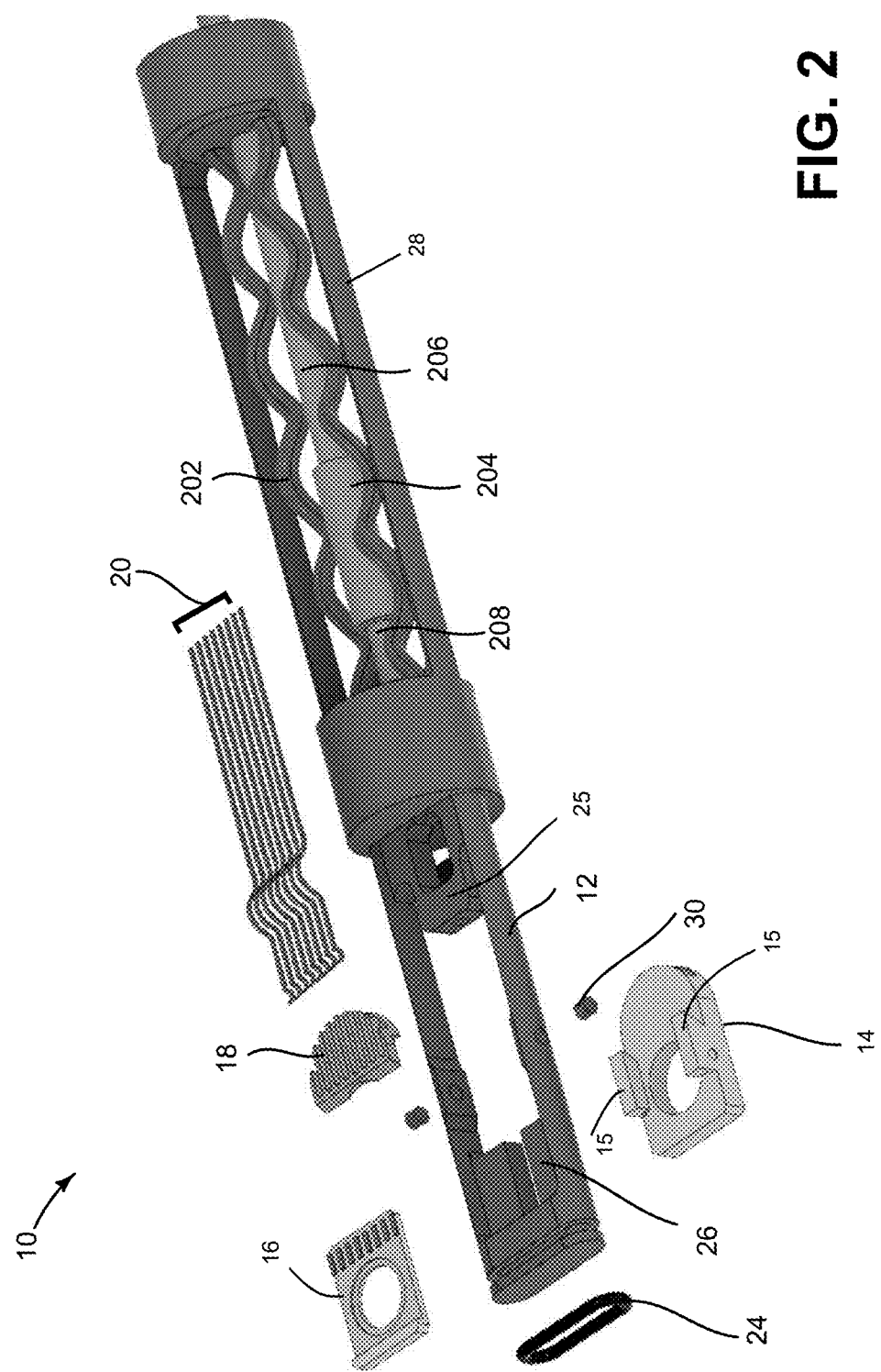
FIG. 2 shows an exploded view of the sample holder tip of FIG. 1A and including a portion of a retraction mechanism.
Figure 5:
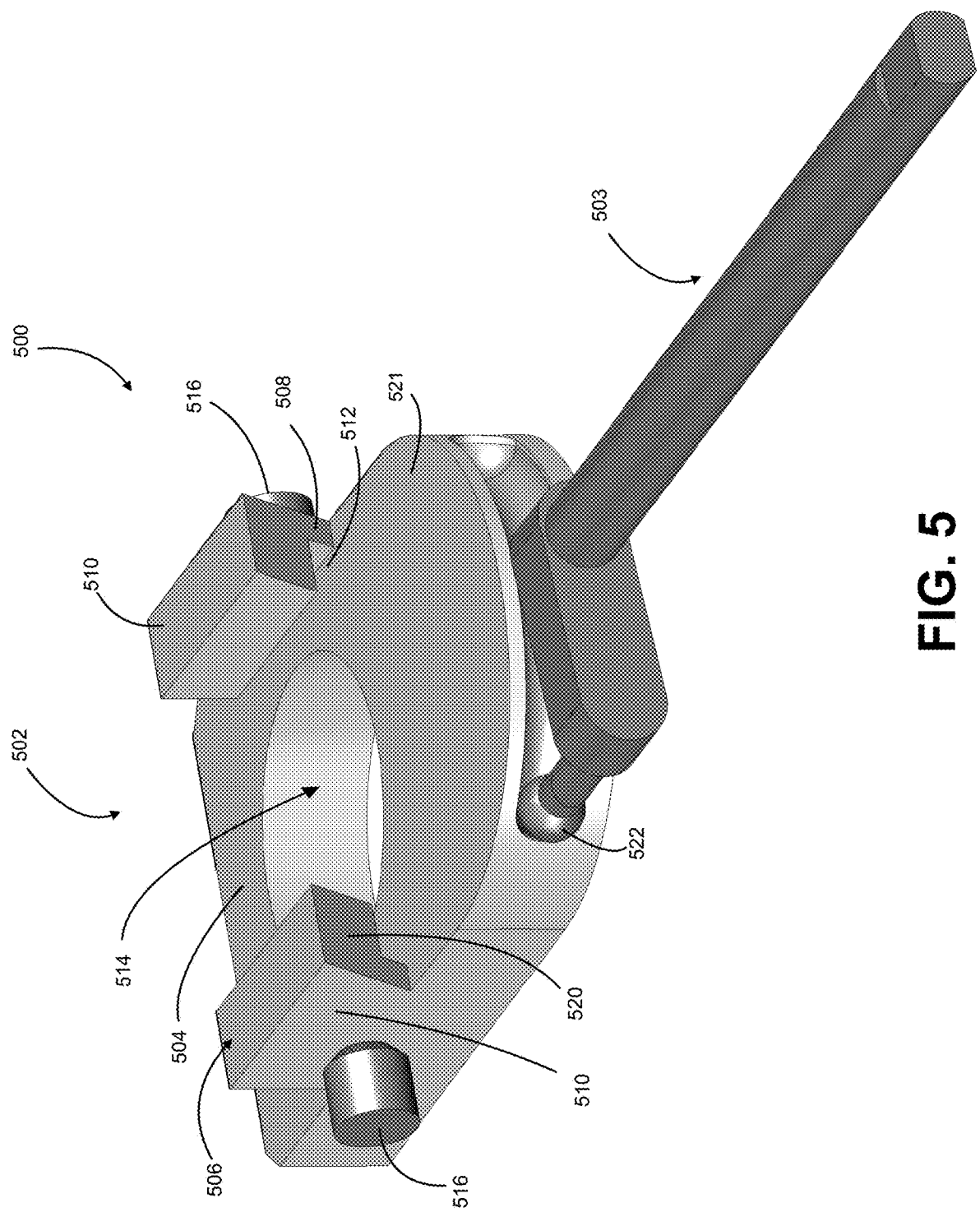
FIG. 5 shows a cradle coupled to a tilt actuator of the sample holder of FIG. 1A.

Turning to FIG. 2, an exploded view of sample holder tip 10 is shown. It may be noted that tilt actuator 22 is not shown for purposes of clarity. Further, cradle 14 is shown on the side for clarity purposes. Thus, the exploded view in FIG. 2 is shown merely to illustrate structure and may not be used to denote relative positions of the various components of sample holder tip 10 and retraction barrel 28. As described above, sample holder tip 10 includes frame 12 comprising platform 26, pair of recess or slots on inner opposite sides of frame 12, O-ring 24, and tilt actuator support portion 25. Cradle 14 is pivoted onto frame 12 adjacent to platform 26 via pair of axles 30 inserted into openings on each of pair of guides 15 on cradle 14 and the slots/openings on the inner sides of frame 12. In some examples, as shown in FIG. 5, pair of axles 30 may be included on the cradle. Alternately, the axles 30 may instead be spherical bearings. Connector support element 18 and a plurality of connecting wires 20 are coupled to cradle 14, and provide support to sample 16 and connection for in situ investigations. Further, as shown in FIG. 2, retraction barrel includes shafts 204, 206, and 208 that collectively function as a drive shaft and convey translating motions for retraction and tilting. Retraction barrel 28 further encloses flexible coated wires 202 that carry one or more signals from a controller to plurality of connecting wires 20. The connecting wires 20 may be coated with an insulating material to avoid shorting with any other conductive portions of the sample holder tip.

Figure 3A:
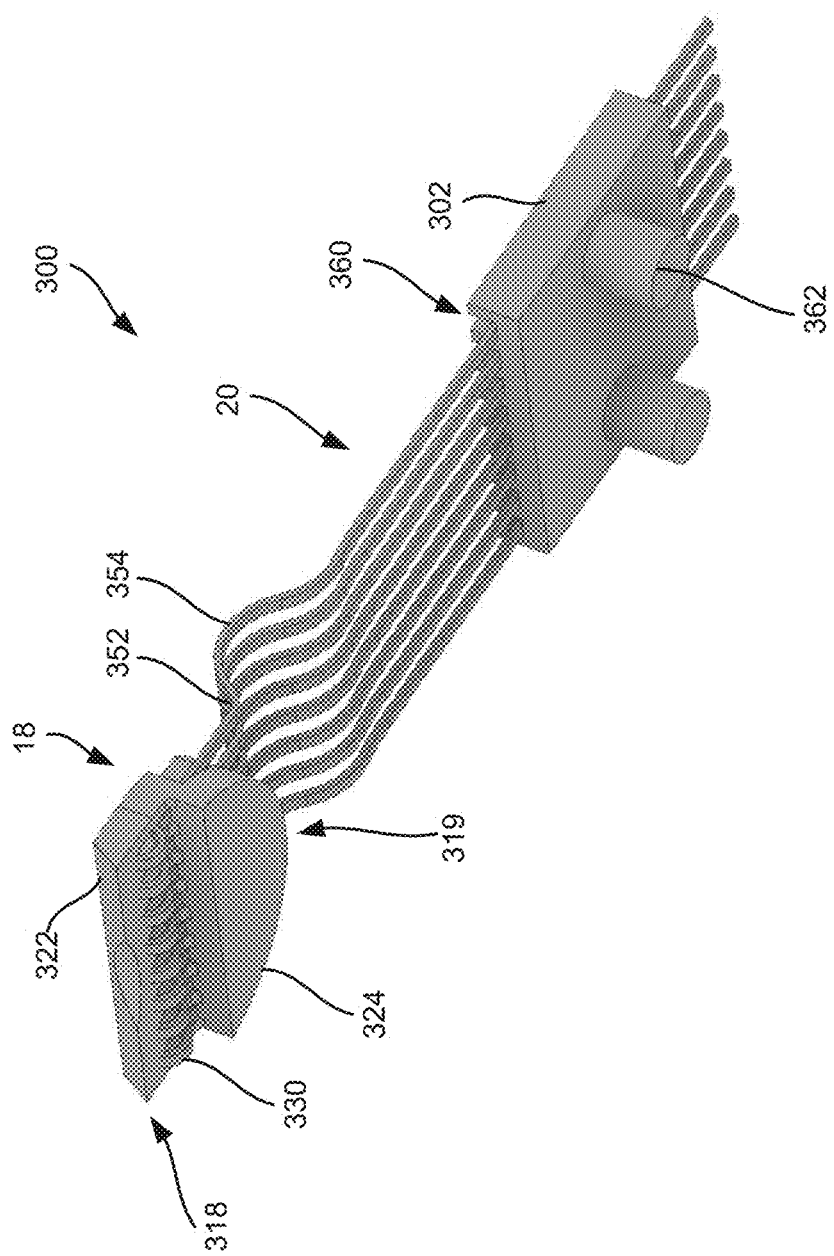
FIG. 3A shows a bottom perspective view of a connector assembly of the sample holder tip of FIG. 1A.
Figure 3B:
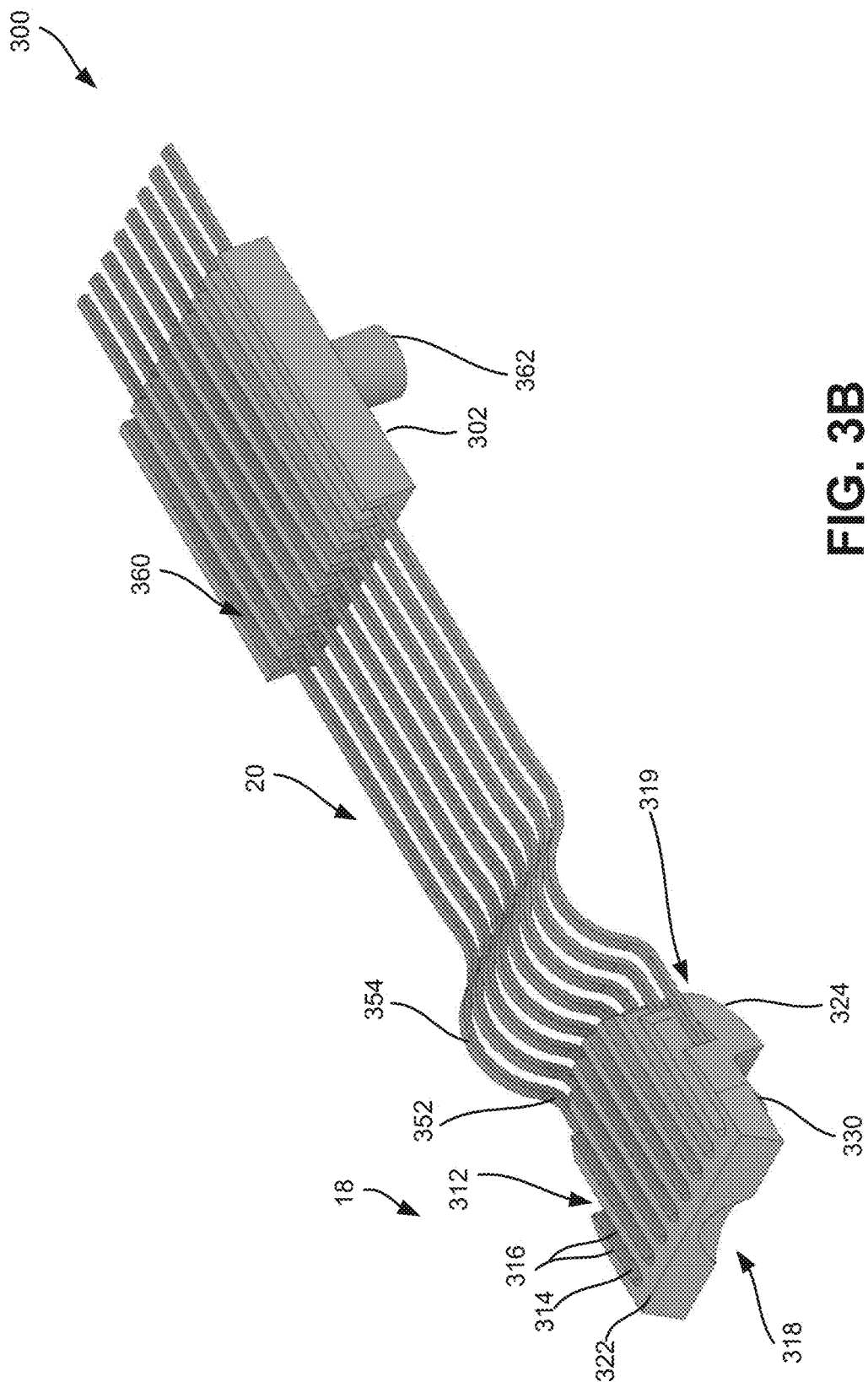
FIG. 3B shows a top perspective view of the connector assembly of FIG. 3A.
Figure 3C:
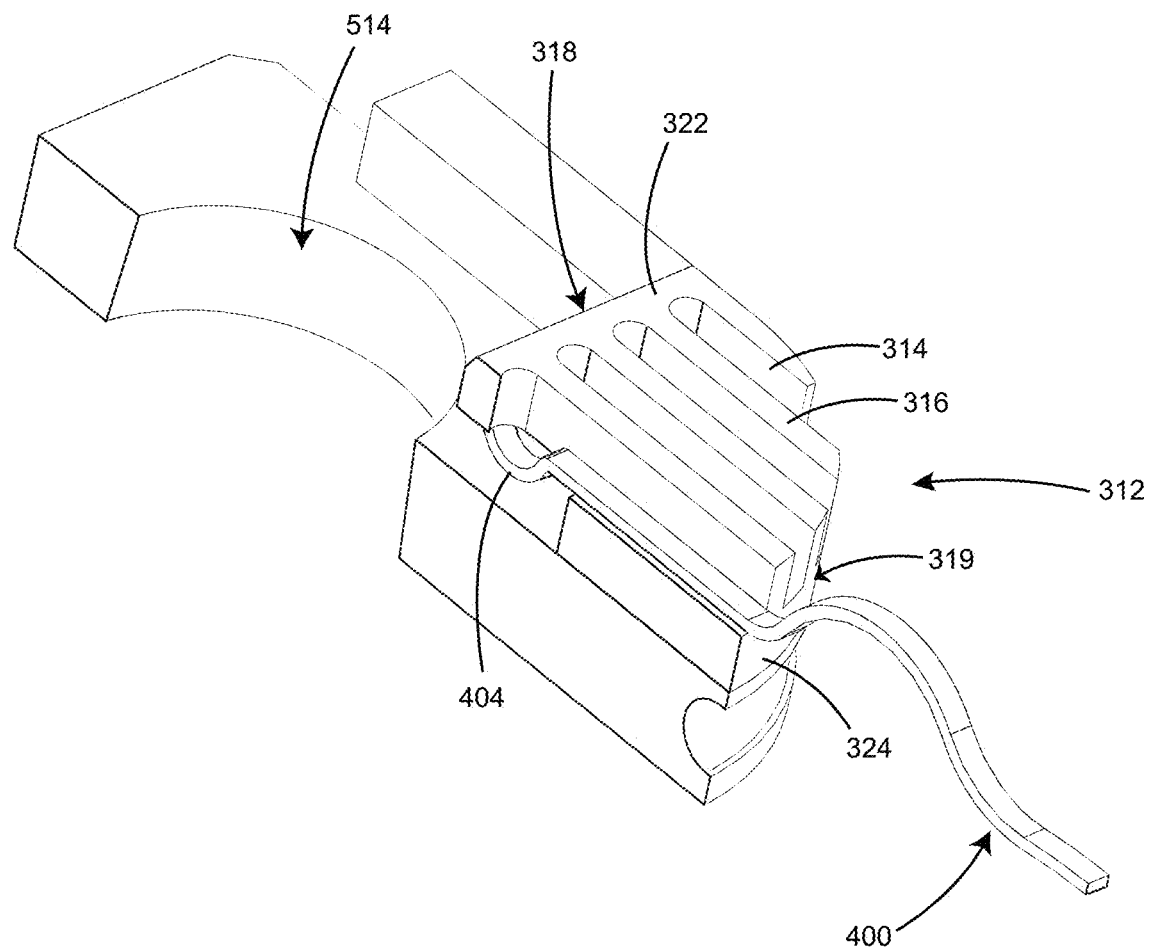
FIG. 3C shows a sectional view of a cradle and connector support element with an exemplary connecting wire.

Next, FIGS. 3A and 3B show bottom and top perspective views of a connector assembly 300. Electrical connector assembly 300 may be included within a sample holder tip, such as sample holder tip 10 at FIG. 1A. During in-situ study of a sample, such as Lithium ion based battery materials using a TEM, connector assembly 300 may be used for delivering one or more desired signals to the sample that is placed within the sample holder tip. The structural and electrochemical changes of the sample material under study in response to the delivered signal are imaged using the TEM. For example, during in-situ study, an electrical signal, such as current/voltage may be applied to the sample through the plurality of connecting wires of the connector assembly and the corresponding structural, chemical and morphological changes of the sample may be observed using the TEM. While the above example illustrates the use of the connector assembly for electrical biasing application, it will be appreciated that the connector assembly may be used in a variety of in-situ studies including but not limited to those in areas such as corrosion, fuel cell, catalysis, photovoltaics, quantum materials. In one example, the signal input to the plurality of connecting wires and the output, including feedback, may be provided, adjusted, and/or recorded using external power supplies with controller capabilities.

Connector assembly 300 includes connector support element 18, a plurality of connecting wires 20, and an internal connector 302. Connector support element 18 is positioned above the cradle of the sample holder, such as cradle 14 at FIG. 1A and directly coupled to the cradle. In one example, the connector support element 18 may be made of a thermo plastic material, such as PEEK (polyether ether ketone), however, it will be appreciated that connector support element 18 may be manufactured using any insulating material that is also a low outgassing material suitable for use in high vacuum, such as ceramic.

Plurality of connecting wires 20 may be configured to deliver one or more signals to the sample under investigation. In one example, a first number of connecting wires may be used to deliver electrical signals/stimuli while a remaining number of connecting wires may be used to deliver a thermal stress/stimuli to the sample under investigation, and vice-versa. In another example, the same set of connecting wires may deliver both electrical and thermal signals at the same time, thus providing electrical biasing while also heating the sample, or deliver electrical signal at one time point and thermal signals at different time points during the in situ TEM experiments on the samples. While the above examples illustrate using the connecting wires for delivering electrical and/or thermal signals to the sample, it will be appreciated that the connecting wires may be configured to deliver one or more additional signals such as electrochemical stimuli.

Connector support element 18 is shown having an overall semi-circular shape with a first portion 322 and a second portion 324 connected to form a step. In the step formed by first portion 322 and second portion 324, first portion 322 is at a higher level with respect to second portion 324. As described further below, each of plurality of connecting wires 20 is positioned below a bottom surface of first portion 322, (that is, below the higher level of the step). Each of plurality of connecting wires 20 include a first downward convex bend 330 that provides a point or region of contact (also referred to herein as connection portion) with the sample which is positioned below first portion 322. Thus, the connection portion (or the first downward convex bend) of each of the plurality of connecting wires is located below the first portion and behind a back wall of second portion 324. As a result, the back wall of second portion 324 insulates the connection portion and the sample below the first portion. In this way, the step-like configuration of connector support element 18 provides protection for the connection portions of each of plurality of connecting wires and the sample.

First portion 322, from a first end 318 up to a mid-portion of connector support element 310, is shown having a first thickness. Second portion 324, from the end of first portion 322 to a second end 319 of connector support element 310, is shown having a second thickness. The first portion and the second portion are shown connected at the mid-portion. In some examples, the first portion may not extend up to the mid-portion and thus, the first and the second portions may be connected before the mid-portion. In some other examples, the first portion may extend beyond the mid-portion and the step connection between the first portion and the second portion may be positioned accordingly. In one example, as shown, the first thickness and the second thickness may be equal. Other examples, where the first thickness is less than the second thickness and vice-versa are also within the scope of the disclosure.

In another embodiment, connector support element 18 may include a step only on its underside. In this configuration, the second thickness of the second portion is greater than the first thickness, and the increase in thickness is such that the bottom surface of connector support element has two levels forming a step at the underside of connector support element. In this embodiment, similar to the example discussed above, the step-like structure of the connector support element insulates the connection portion and the sample below the first portion.

As shown in FIG. 3B, connector support element 18 includes a plurality of channels 312 that extent along the length of the connector support element 18 from first end 318 to second end 319. Plurality of channels 312 are parallel to each other, and extend across first portion 322 and second portion 324 of connector support element.

A groove and a pair of ridges flanking either side of the groove form each of plurality of channels 312. Thus, each connector support element 18 includes a plurality of grooves 314 and a plurality of ridges 316 forming plurality of channels 312. Each of the plurality of ridges 316 are shown continuous across the length of connector support element 18 and extend continuously from first portion 322 to the edge of second portion 324. Plurality of grooves 314 are shown continuous across the length of the connector support element 310 and extend continuously from first portion 322 to the edge of second portion 324. As further described below, plurality of channels 312 on the first portion 322 of connector support element 18 are configured as open slots, wherein a base of each of the plurality of channels 312 is open to allow connecting wires 320 to pass through. However, on the second portion 324 of connector support element 18, each of plurality of channels 312 are shown as having a solid base portion, thus forming a pathway to lead each of connecting wires 20 across connector support element 18. In the present example, a height of each of plurality of ridges 316 is shown to be equal.

A number of channels 312 correspond to a number of connecting wires 20. For example, in a connector assembly 300 including eight connecting wires, eight channels formed by eight grooves and nine ridges are included. While the present example illustrates eight connecting wires, the connector assembly may include more or less number of wires. Further, it may be noted that the number of wires may be even so as to provide a balance and equal tilt angle across the sample during conditions when the sample is adjusted to beta tilt positions As mentioned above, each of plurality of channels 312 on first portion 322 of connector support element 18 is open at the bottom. Thus, plurality of channels 312 form slots through which connecting wires may pass through. Each of plurality of channels 312 on second portion 324 of connector support element 18 is closed at the bottom. Thus, a base of second portion 324 of the connector support element is solid without any openings, and plurality of channels 312 on the second portion 324 form a pathway that also provides structural support for connecting wires 20. Further, plurality of channels 312 are shown closed towards first end 318 and open at second end 319. In this way, plurality of channels 312 are configured as slots with opening at the bottom on first portion 322 of connector support element 18 and as pathways that also provide structural support to connecting wires 20 on second portion 324 of connector support element 18.

Each of plurality of connecting wires 20 are positioned below first portion 322 at the under side of connector support element 18. Specifically, a first end of each connecting wire 20 is positioned below a portion on the bottom surface between a first edge and a beginning of each of channels 312. Specifically, the first end of each connecting wire 20 may be positioned such that there is a small gap between the first end of each connecting wire and the bottom surface of connector support element 18.

Further, at the first end, each of plurality of connecting wires 20 is curved to form a first convex bend structure 330 that bulges downward towards cradle 14 from the bottom surface of connector support element 18. As described above, the first end is not coupled to connector assembly, which allows movement of the first end and the convex bend structure, which allows the cradle to accommodate samples of varying thickness. In other words, the first end and convex bend 330 are movable, which provides flexibility to accommodate samples of varying thickness as discussed further below.

Further, when the sample is fully mounted, first downward convex bend 330 of each of plurality of connecting wires 320 makes direct physical contact with the sample and thus, each convex bend 330 of each connecting wire 20 provides a contact surface between the sample and connector assembly 300. Connecting wires 20 maybe made of material with high spring constant, such as Beryllium Copper (BeCu). Further, connecting wires 20 may have a degree of flexibility to form bends and kinks while providing sufficient rigidity to hold form and structure. Convex bend 330 combined with the spring force of the connector material allows the sample to stay in place while maintaining connection with the connecting wires. Further, convex bend 330, the spring force, and the gap between the first end and the bottom surface of connector support element 18 allow use of wide range of thickness of sample without losing contact with the connecting wires. For example, the gap may allow an upward movement of connecting wires 20 to accommodate thicker samples. In this way, the first end and convex bend 330 of each of plurality of connecting wires 20 provide a flexible arrangement for accommodating samples of varying thickness while providing direct contact with the sample for in situ experiments and securing the sample in place.

Further, in a relaxed state, when no sample is present, a small gap may be present between the convex bend 330 of each of connecting wire 20 and a top surface of the cradle. The small gap may also be referred to herein as separation between convex bend 330 of connecting wires and top surface of the cradle, or simply referred to as separation between the connecting wires and the cradle.

During sample loading, the sample under study is inserted between the cradle and connector support element, and pushed below the connecting wires. Thus, the sample is held in place by the friction and spring force of the connecting wires pressing against the sample, which also provides direct physical contact with the connecting wires. This eliminates the need for securing the sample with additional fasteners, and greatly simplifies the sample loading process for an end user. Further, the convex bend and spring force allows very thin samples to be secured and connected with reduced effort. As a thickness of the sample increases, the sample pushes against convex bend 330 of connecting wires 20, and the spring force of connecting wires 20 and the gap (between the first end of connecting wires 20 and the bottom surface of first portion 322 of connector support element 18) allow convex bend 330 portion of connecting wire 20 to move upward to increase space to accommodate thicker samples, while maintaining the contact between the connecting wires and the sample.

The separation between the connecting wires and the cradle plate may be based on a minimum thickness of sample desired. Further the separation between the connecting wires and cradle may be adjusted by adjusting a curvature of the convex bend. For example, in order to decrease the separation between the convex bend of connecting wires and the cradle, a curvature of the convex be may be increased.

Each of plurality of connecting wires 20 come out from the underside through respective slots in each of plurality of channels 312. Each of plurality of connecting wires 20 traverse along respective pathways in each of plurality of channels 312 on second portion 324 and exit at second open end 319 of connector support element 310. Further, connecting wires 20 are shaped so that they can be inserted through the slots and into grooves 314 of channels 312. These slots also allow for movement of the first end and convex bend 330 to accommodate samples of varying thickness. Thus, an amount of opening of the slots and the radius of the first bend contribute to a degree of flexibility of connecting wires and a degree of freedom to accommodate samples of varying thickness. Although grooves 314 may provide support to keep connecting wires 20 in place, in order to add strength and support to connecting wires 20, groove 314 may be filled with vacuum grade epoxy or a suitable adhesive.

The end of second portion 324 is shown semi-circular in shape. It will be appreciated that other shapes, such as symmetrical geometrical shapes (rectangular, square, etc), are also within the scope of the disclosure.

In another embodiment, the connector support element, such as connector support element 18 at FIGS. 3A and 3B may be configured as shown in FIGS. 3D and 3E. Specifically, first portion 322 may be configured as having a second plurality of channels formed as parallel open slots on the first portion 322, and the second portion 324 may be configured with a third plurality of channels 350 on the underside of the connector support element, with the upper side (top surface) of the second portion 324 being solid. Each of third plurality of channels 350 may be formed by a groove and a pair of ridges, and each of the third plurality of channels form a pathway for guiding the connecting wires from the underside of the connector support element. In this embodiment, the step-wise configuration of the underside may be maintained. Thus, in this embodiment, the connector support element includes a first portion comprising a plurality of parallel open slots and a second portion comprising a plurality of parallel pathways on the underside of the connector support element, wherein each of the plurality of parallel pathways are closed on the upper side. In this embodiment, each of the plurality of connecting wires 20 at the first end may be positioned at the underside of the connector support element below the first portion 322. The connecting wires may then form a downward convex bend at the first end that bulges outward from the underside of the first portion 322. As discussed above, the downward convex bend at the first end provides a contact portion for the connecting wires with the sample. Further, the movement of the first end and the downward convex bend allows samples of varying thickness to be mounted and secured. Immediately after the convex bend, each of the connecting wires may enter the respective slots on the first portion from the underside of the connector support element and exit the respective slots from the upper side of the connector support element. The connecting wires may then traverse the first portion along the length of the slot, and then re-enter the connector support element through a plurality of openings that connect the slots on the first portion with the plurality of channels on the underside of the connector support element. Thus, each the slots and each of the plurality of channels on the underside have a common opening through which the connecting wires re-enter the connector support element. Upon re-entering the connector support element, the connecting wires traverse the length of the second portion along the respective pathways formed by each of the plurality of channels and exit from the underside of the connector support element.

In any embodiment, connecting wires 20, after exiting the connector support element (either via channels on the upper side of the second portion or channels formed on the underside) traverse across and over the tilt mechanism, such as tilt actuator 22 at FIG. 1A that is used to provide beta-tilt of the sample stage. The inventor has identified that when the connecting wires are fixed and connect directly to an internal connector in a straight configuration, for example, in a linear configuration, it restricts a degree of beta-tilt of the sample stage to a very small angle. In some cases, the rigidity of the connector does not allow even a small degree of beta-tilt of the sample stage, and thus, are not suitable for crystallography-based analytical studies, for example. In general, if a sample crystal is not tilted in a high symmetry direction, TEM cannot provide atomic resolution or easily interpret electron diffraction patterns.

Further, the inventor has identified that if the connecting wires are rendered in a straight configuration and if beta-tilt is attempted, even at very small tilt angles, repeated tilting of the stage would result in fatigue and failure of the connecting wires. For example, the connecting wires may break or the connections to the connecting wires may break, rendering the sample holder defective. Furthermore, some previous solutions involve connecting one or more flexible wires to the connecting wires via soldering, the flexible wires are then connected to the internal connector. In this way previous solutions have attempted to provide beta-tilt to the sample stage. However, the inventor has identified many disadvantages with such an approach. For example, after repeated tilting of the stage, the fatigue sets at the soldered joint, which eventually results in failure and breakage of the connection between the connecting wires and flexible wires.

Thus, in order to reduce interference with the tilt mechanism while providing flexibility for beta-tilt of the sample stage, reducing fatigue of the connecting wires, and maintaining stable connection, one or more additional bends and kinks are provided for each of the plurality of connecting wires. As discussed above connecting wires 20 may be made from Beryllium Copper (Be—Cu) or any other material with high spring constant. Be—Cu or a material with high spring constant, when used as wire or strip with appropriate thickness, provides flexibility in the connecting wires and allows the formation of bend and kinks.

Returning to FIGS. 3A and 3B, each of plurality of connecting wire 20 may include a second bend 352 immediately after exiting the connector assembly, and a third bend 354 over the tilt mechanism. The second bend may be bulging downwards forming a downward convex bend and the third bend may be bulging upwards forming an upward convex bend. Thus, with the second bend and the third bend, the connecting wires 20 may appear to form a wave-like structure with alternating downward and upward bends. The second downward convex bend 352 may have a smaller curve radius than the third upward bend. Specifically, the curve radius of the third upward convex bend may be based on a length and a height of the tilt mechanism connected to the cradle and a desired threshold of beta-tilt. That is, the curve radius of the third upward convex bend may be such that the connecting wires maintain its position above the tilt mechanism and reduce interference with the tilt mechanism during all positions (for example, 0 degree beta tilt to a threshold degree beta tilt) of the sample stage. In some examples, the first downward convex bend may be formed as a kink in the connecting wires 20. In some other examples, one or more additional kinks may be present in addition to the second downward convex bend and the third upward convex bend. While the present example illustrates the second and third bends as downward and upward convex bends, it will be appreciated that any other type of bend or kink that provides flexibility and balance for tilting mechanism, reduces interference of the connecting wires with the tilting mechanism while maintaining connection with reduced fatigue and failure rates are also within the scope of the disclosure.

Figure 4:
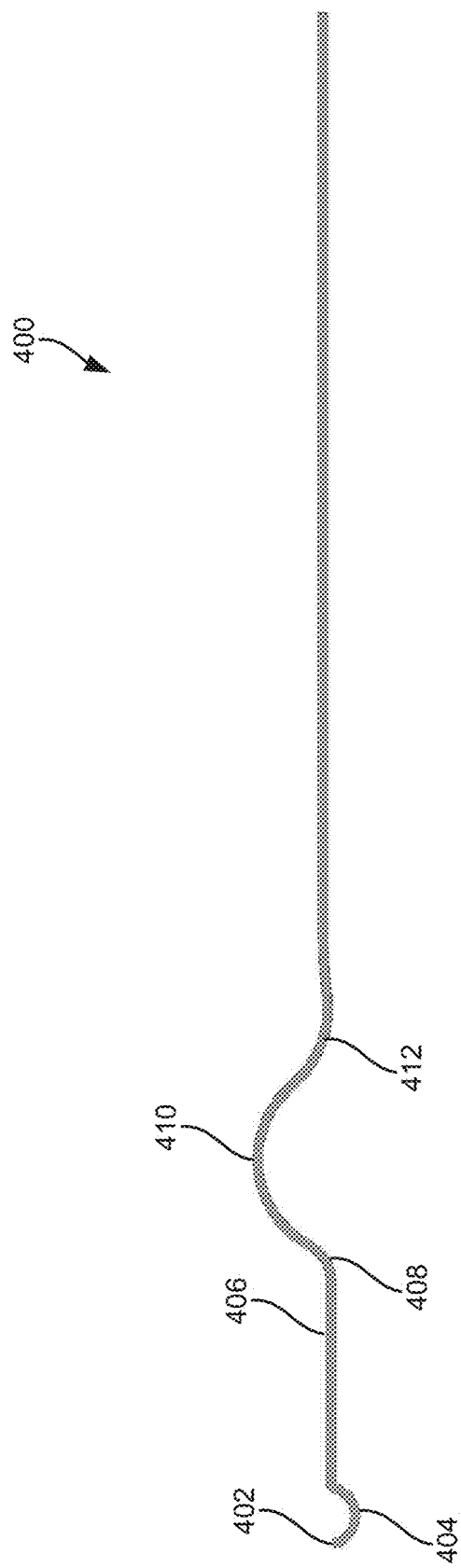
FIG. 4 shows a side view of a connector wire, according to the present invention.

An example connecting wire with kinks and bends is shown at FIG. 4. Connecting wire 400 may be an example of any of plurality of connecting wires 20. First end 402 of connecting wire 400 is positioned at an underside of a connector support element, such as connector support element 310 shown in FIG. 3. First end 402 has freedom of upward and downward movement, that is, first end is not coupled to the connector support element. Connecting wire 400 may include a first convex bend 404 bulging downwards towards the sample stage. A trough or a lowest point of the first convex bend is the point or area of contact with the sample under investigation. During sample preparation, a user may slide the sample under the connecting wires below first convex bend 404. The convex bend provides direct connection for in situ studies while securing the sample in its position. Connecting wire 400 may be made from BeCu or a high spring constant material. Thus, the freedom of movement of first end of connecting wire 400 and spring force of the connecting wire material allow a wide range of thickness of sample to be secured and studied while providing direct physical connection to provide signals during in situ investigations. In this way, the first convex bend of the connecting wire 400 is used to secure the sample on the stage, provide connection, and allow a wide range of thickness of sample to be studied under the TEM.

Further, due to the support provided by the convex bend of the connecting wire, no additional screws or fastening mechanism is required to position and secure the sample onto the stage. A user may slide the sample onto the sample stage with the help of guides on either sides of the cradle of the sample stage. Further, a portion of the sample is inserted below the first convex bend of the connecting wire. The guides on the cradle and the connecting wires secure the sample on to the sample stage without use of any additional fasteners or lids. In this way, the connecting wire is configured to provide contact with the sample and secure the sample during in-situ TEM studies.

Connecting wire 400 is shown to include a linear portion 406 that travels along the length of a channel, such as a channel 312 shown in FIGS. 3A and 3B, of connector support element 18. At the end of the linear region away from the first convex bend, a first kink 408 may be present in the connecting wire. While the present example illustrates the first kink, in some examples, a second downward convex bend may be included in lieu of the first kink. The first kink may have a curvature smaller than the first bend in a downward direction. Immediately following first kink 408, connecting wire 400 includes a third bend 410. Third bend 410 may be an upward convex bend and may have a curvature based on a size of the beta-tilt mechanism, such as tilt actuator 22 at FIG. 1A. Connecting wire 400 may further include a second kink 412 at the end of the second bend before continuing in a straight path to an internal connector, such as internal connector 303 at FIGS. 3A and 3B. The curvature of the third bend 410 allows the tilt actuator (e.g., tilt actuator 22 at FIG. 1A) to rotate. Further, the curvature of the third bend that is positioned over the beta-tilt mechanism may be further based on the shape of a retraction barrel, such as barrel 28 at FIG. 1A, within which the sample holder tip is retracted. In other words, the curvature of third upward convex bend may be such that it allows the tip to be retracted into and extended from the retraction barrel.

While the present example in FIG. 4 describes a connecting wire with two bends and two kinks, it will be appreciated the one or more additional kinks and bends are also within the scope of the disclosure. The one or more additional kinks and bends may be provided based on one or more of the specific type of beta-tilt mechanism (tilt actuator), a size of the cradle, and specific shape of the connector. The one or more additional kinks and bends may be configured to provide sample support, connection to the sample, provide flexibility for the beta-tilt mechanism thereby increasing the range of beta-tilt, while reducing fatigue and failure rates for the connecting wires.

Returning to FIGS. 3A and 3B, connector assembly includes an internal connector 302. Internal connector 302 is coupled to each of plurality of connecting wires 320 on one end. Internal connector 302 is further coupled to one or more flexible insulated wires that carry signals corresponding to the plurality of connecting wires 20 on a second opposite end. The one or more flexible insulated wires may be then coupled to a controller. In one example, the controller may be located outside the sample holder assembly. The controller may input signals to plurality of connecting wires based on a user input, for example. Other examples, wherein a microcontroller is located within a user interface of a sample holder assembly and wherein a user may input signals through the microcontroller via the user interface are also within the scope of the disclosure.

Next, FIG. 5 illustrates a cradle and tilt assembly 500 of a sample holder tip, such as sample holder tip 10 at FIG. 1A. Cradle and tilt assembly 500 may be coupled to a frame, such as frame 12 of sample holder tip 10 shown in FIG. 1A. Cradle and tilt assembly 500 includes a cradle 502 and a tilt actuator 503. Cradle 502 may be similar to cradle 14 shown at FIG. 1A, and tilt actuator 503 may be similar to tilt actuator 22 shown in FIG. 1A. Cradle 502 includes a sample stage 504 onto which a sample, such as sample 16 shown at FIG. 1D, is positioned. Sample stage 504 includes a circular opening 514 for allowing electrons to pass through during microscopy analysis.

Cradle 502 further includes a pair of guides 506 on opposite sides of sample stage 504 for guiding and positioning the sample during sample preparation. Further, each of pair of guides 506 are also configured for providing a supporting structural base onto which a connector support element, such as connector support element 18 at FIG. 3A may be attached. For example, each of pair of guides 506 may include an opening or a gap, as discussed further below, that provides a pathway for positioning the sample on to sample stage 504.

Each of pair of guides 506 is shown having a stem-like portion 508 that extends vertically from sample stage 504 and a rectangular block portion 510 above stem-like portion 508. A thickness of stem-like portion 508 is less than a breadth of rectangular block portion. As such, stem-like portion 508 is a downward extension of a bottom edge portion of rectangular block portion 510. Stem-like portion 508 is sandwiched in between sample stage 504 and rectangular block portion 510. Thus, there is a gap 512 between a bottom surface of rectangular block portion and a top surface of sample stage 504. Said another way, each of pair of guides 506 are positioned above sample stage 504 on opposite sides with a gap between the bottom surface of rectangular block portion 510 and top surface of sample stage 504. Rectangular block portion 510 and sample stage 504 are connected via stem-like portion 508. When viewed along the line of sight of the X-axis, each of pair of ridges may appear to have an inverted L-shaped structure. During sample loading, the user may position the sample on to the platform of the sample holder frame and slide the sample through the gap between each of the pair of guides 506 and sample stage 504. In this way, each of pair of guides 506 with a gap between pair of guides 506 and sample stage 504 are configured for guiding movement and positioning of the sample during sample preparation.

In addition to guiding sample insertion and positioning on the sample stage, each of pair of guides 506 are used to couple the connector support element and the plurality of connecting wires with cradle 502. Thus, the connector support element along with the plurality of connecting wires may be coupled to cradle 502 of cradle and tilt assembly 500. Specifically, the connector support element along with the plurality of connecting wires may be positioned on a top surface of the portion of cradle, and the connector support element is directly coupled to cradle 502. Specifically, connector support element along with the connecting wires is directly coupled to each of pair of guides 506 on cradle 502. Each of pair of guides 506 includes a side attachment surface 520 that engages with a complementary surface on the connector support element. In the present example, the side attachment surface is shown having a diagonal shape with an acute angle with respect to a top surface of the sample stage. Thus, the complementary surface on the connector support element is also diagonal with the same acute angle with respect to the top surface of the sample stage. The connector support element and cradle 502 may be coupled by using a vacuum-compatible adhesive or any other method suitable such as use of fasteners for providing a permanent or semi-permanent joint. In this way, cradle 502 provides a base support for the connector support element and the connecting wires.

A shape of the portion of cradle 502 onto which the connector support element is positioned is designed to be similar as that of a shape of the connector support element. In the present example, both the portion of cradle 502 and the connector support element are semi-circular in shape. Other geometrical shapes that are compatible with the sample holder frame are also within the scope of the disclosure. In some examples, additionally or alternatively to coupling the connector support element with the pair of guides on the cradle, the connector support element may be coupled to an edge 521 of cradle 502.

In one example, sample stage 504 and pair of guides 506 may be machined into a single piece. In other example, sample stage 504 and pair of guides 506 may be manufactured individually and coupled together using a permanent sealing method, for example by using a vacuum-compatible adhesive.

Cradle 502 further includes a pair of axles 516 protruding from opposite outer side surfaces of cradle 502. Pair of axles 516 may be used to mount cradle to the sample holder frame, while allowing cradle to tilt along y-axis (beta-tilt). The sample holder frame may include complimentary openings, such as holes, into which each of pair of axles 516 may be inserted and linked. Cradle 502 may be pivoted about the Y-axis along the line of linkage of cradle 502 with the sample holder frame. Cradle 502 may be coupled with the sample holder frame through a movable joint.

Cradle 502 is shown coupled to a tilt actuator 503 for tilting the cradle along y-axis. Tilt actuator 503 may be coupled to cradle 502 via a linkage 522. Linkage 522 may comprise a spherical bearing, for example. For example, cradle 502 may include a groove within which the spherical bearing may travel along. Tilt actuator 503 may include a motion exchange mechanism, wherein a rotation motion of a drive shaft of the tilt actuator is converted to tilt motion of cradle 502 about the Y-axis. The rotation of the drive shaft of the tilt actuator may be provided by a motor drive mechanism (not shown) within a controller end of the sample holder assembly. For example, counter clockwise rotation of the drive shaft will result in positive beta tilt (wherein front of the cradle, adjacent to the platform 26 of sample holder tip, moves upwards) while clockwise rotation of the drive shaft will result in negative beta tilt (wherein front of the cradle moves down).

Figure 6:
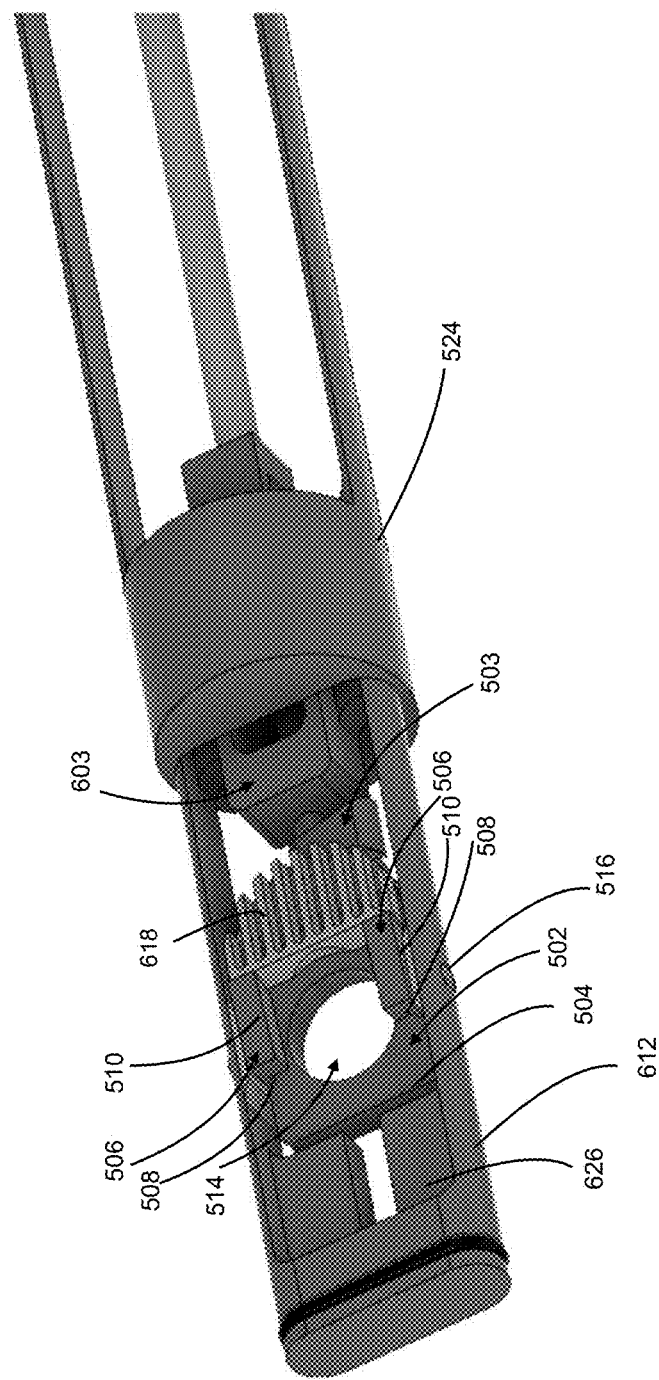
FIG. 6 shows a perspective view of an example sample holder tip, such as sample holder tip of FIG. 1A, showing the connector support element of FIG. 3C coupled to the cradle and the tilt actuator shown in FIG. 5, and without the plurality of connecting wires.

Next, FIG. 6 shows cradle 502 of the cradle and tilt assembly of FIG. 5 coupled to a sample holder frame 612 via pair of axles 516. Cradle 502 is shown positioned adjacent to a platform 626. Further, cradle 502 is coupled to a connector support element 618, which is similar to connector support element 18 of FIG. 1A. Sample holder frame 612 further includes an actuator support structure 603 for tilt actuator 503 of the cradle and crank assembly. For purposes of clarity, connector support element is shown without the plurality of connecting wires.

Turning to FIGS. 7A and 7B, top and bottom perspective views of sample holder tip 10 is shown with the cradle and tilt assembly and the connector assembly in a beta-tilt position, wherein the cradle and the connector assembly are tilted at an angle about the Y-axis (Y-Y') by the tilt actuator. Sample holder tip 10 corresponds to the sample holder tip shown in FIGS. 1A-1C, and thus, the some of the labels on FIGS. 7A and 7B are same as the labels on FIGS. 1A-1C. Thus, for purposes of clarity, the descriptions in FIGS. 1A-1C will not be repeated below.

As discussed above, each of plurality of connecting wires 20 includes a kink or a small downward convex bend 19 and an upward convex bend 21 that allows positioning of connecting wires 20 above the tilt actuator at all angles of beta tilt. Thus, the one or more additional bends and kinks, including downward convex bend 19 and upward convex bend 20, on each of the plurality of connecting wires 20 allow a greater degree of beta-tilt of the cradle and the connector assembly. Further, a degree of beta tilt may be based one or more of the curvature of upward convex bend 20, a thickness of the plurality of connecting wires 20, and spring constant of plurality of connecting wires 20.

Due to the presence of the one or more additional bends and kinks on each of the plurality of connecting wires 20, interference of connecting wires 20 with the beta-tilt actuator 22 is reduced, which permits a greater degree of beta-tilt about the Y-axis. Further, as each of plurality of connecting wires 20 are made of a material with a high spring constant, the one or more bends and kinks reduce the stress loading on the connecting wires 20 during repeated tilting motions. Furthermore, the one or more bends and kinks provide uniformity of beta-tilt across the cradle and the connector assembly. Further still, by positioning plurality of connecting wires above the tilt actuator, a need for having a larger frame size to accommodate plurality of connecting wires 20 is greatly reduced. Thus, a compact configuration of the sample holder is achieved, which in turn allows the sample holder tip to be retracted into retraction barrel 24 of sample holder assembly, thereby making the sample holder suitable for use with air-sensitive samples.

Figure 8C:
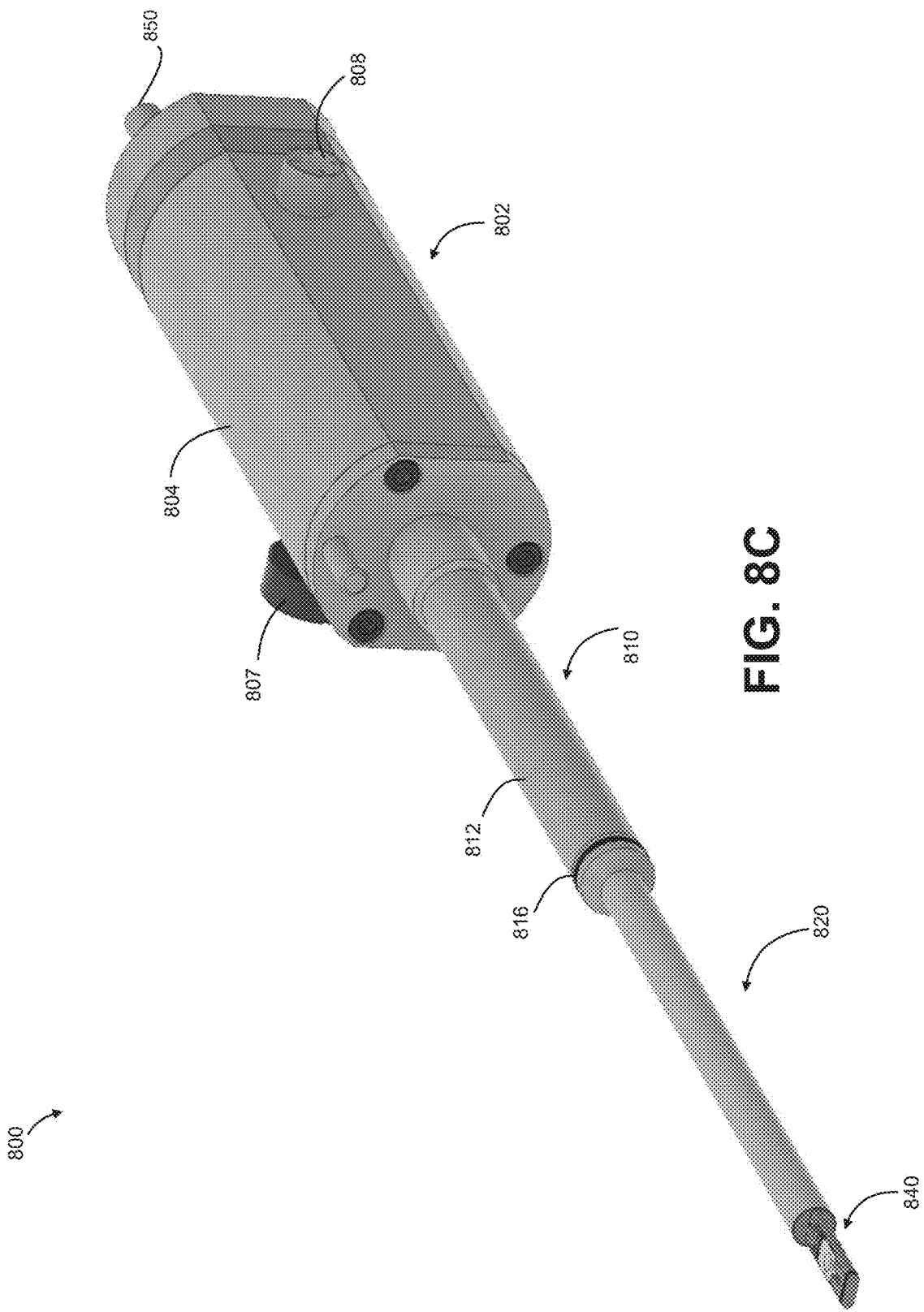
FIG. 8C shows a second perspective view of the sample holder assembly of FIG. 8A including the sample holder tip shown in FIG. 1A in an extended position.
Figure 8D:
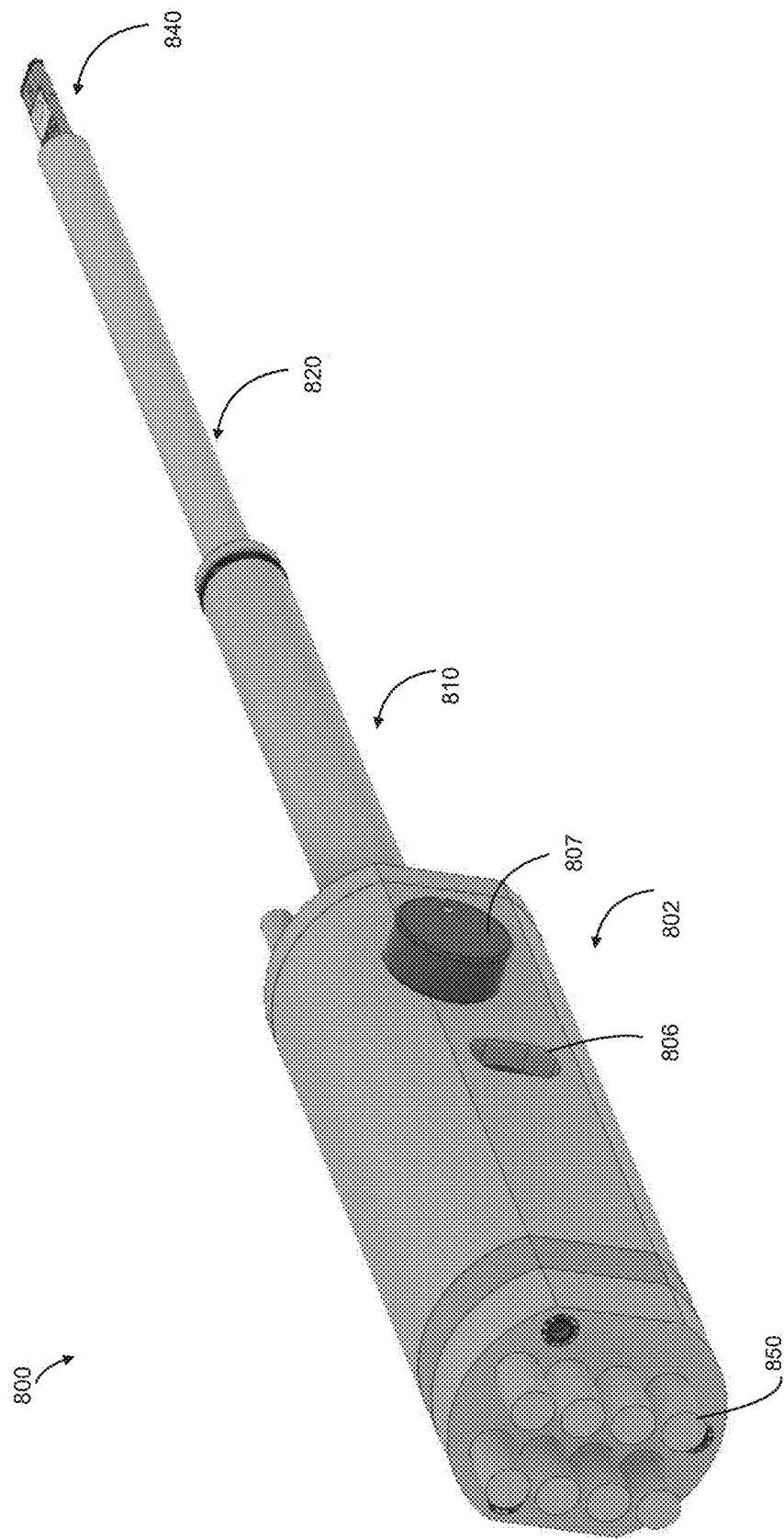
FIG. 8D shows a third perspective view of the sample holder assembly of FIG. 8A including the sample holder tip shown in FIG. 1A in an extended position.

Turning next to FIGS. 8A and 8B, a perspective view and a front view of a sample holder assembly 800 is shown with the sample holder tip in a retracted position, and FIGS. 8C and 8D show front perspective and back perspective views of sample holder assembly 800 with the sample holder tip in an extended position.

Sample holder assembly 800 includes an actuator and controller portion 802 that comprises a housing 804 enclosing a motor mount assembly (not shown) for adjusting beta tilt. The motor mount assembly may include a beta tilt motor (not shown) and a gear head (not shown) to change gear ratio. The motor mount assembly further includes an encoder (not shown) for tracking motor position, and a graduated wheel (not shown) indicating the motor position. The indications are visible through a window 806 on housing 804. Housing 804 may further include one or more groves (not shown) along the length of the housing for accommodating one or more wires on the periphery of the housing.

The motor of the motor mount assembly is coupled to a first end of a drive shaft (not shown) enclosed within a drive shaft housing 812 in a second portion 810 of the sample holder assembly.

The actuator and controller portion 802 may further include a first knob 807 for adjusting the extent that the sample holder tip 840 is retracted into or extended away from the retraction barrel 820. The actuator and controller portion 802 may further include a second connector 808 that provides an interface for communicatively connecting with an external controller that provides signals to the motor mount assembly for beta tilt actuation.

The drive shaft may be connected to a second shaft (not shown) at a second opposite end (not shown). The second drive shaft may be enclosed in a retraction barrel 820 of the sample holder assembly 800. The drive shaft housing 812 and the retraction barrel 820 may be directly coupled and sealed by an O-ring 816. The second shaft may be further coupled to an internal connector, such as internal connector 302 shown at FIG. 3A, which is coupled to plurality of connecting wires.

The actuator and controller portion 802 may include one or more connector jacks 850 for interfacing with an external computer that provides input to and receives signal output from plurality of connecting wires.

The actuator and controller portion 802 may further include and a rack and pinion gear assembly for retraction of the sample holder tip into the retraction barrel 820.

The internal electrical connector may be enclosed within retraction barrel 820 at an end proximal to the sample holder tip. The internal electrical connector is electrically coupled to one or more flexible coated wires (not shown) that run along the second drive shaft and are positioned within the retraction barrel 820. These wires carry electrical signals between a controller and the sample, and may be used for electrical biasing of the samples.

At the distal end of the sample holder assembly is a sample holder tip 840, which includes a frame that is coupled to the second drive shaft within the retraction barrel via the internal connector. Sample holder tip 840 is similar to sample holder tip 10 described above with respect to FIGS. 1A-1C, 2, 7A and 7B. The second drive shaft is further coupled to the beta-tilt actuator of the sample holder tip.

During sample loading of air sensitive samples, the sample holder assembly may be positioned within a glove box having an inert gas atmosphere, and the air sensitive sample may be positioned on the sample stage of the sample holder tip such that the air sensitive sample is secured by each of the plurality of connecting wires and each of the pair of guides on the cradle. Upon mounting the air-sensitive sample, the sample tip may be retracted within the retraction barrel and sealed in an inert gas environment within the retraction barrel. After retracting the mounted sample holder tip, the sample holder assembly may be transported to the TEM assembly. The sample holder assembly is then inserted into the TEM assembly such that the sample holder tip is within a column of the TEM. When the insertion is completed, the actuator and controller portion of the sample holder assembly remains outside the TEM and provides an interface for adjusting a tilt of the mounted sample and for retraction and extension of the sample. The actuator and the controller portion also provide an interface for providing one or more signals/stimulations during in situ experiments.

In one example, the signals for in situ experiments may be input at a user interface of the actuator and controller assembly. In some other examples, the actuator and controller assembly may receive one or more inputs from an external source.

Figure 9A:
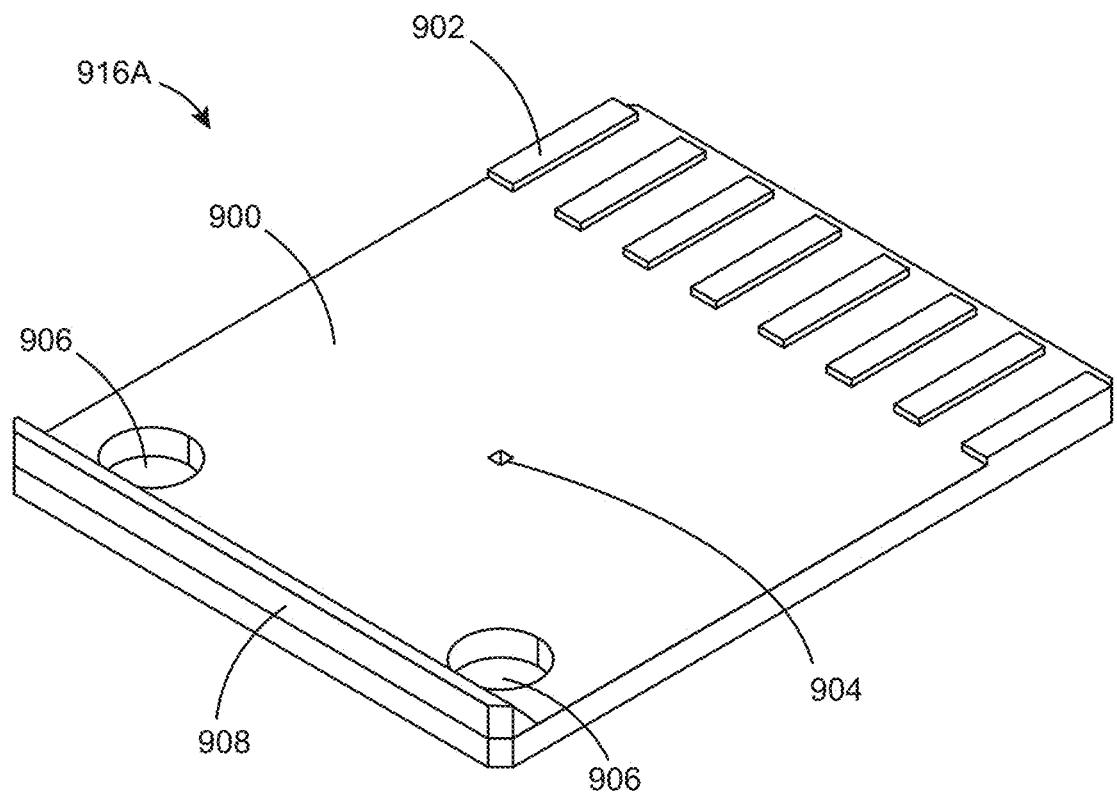
FIG. 9A shows an exemplary sample chip having one or more mounting facilities.
Figure 9B:
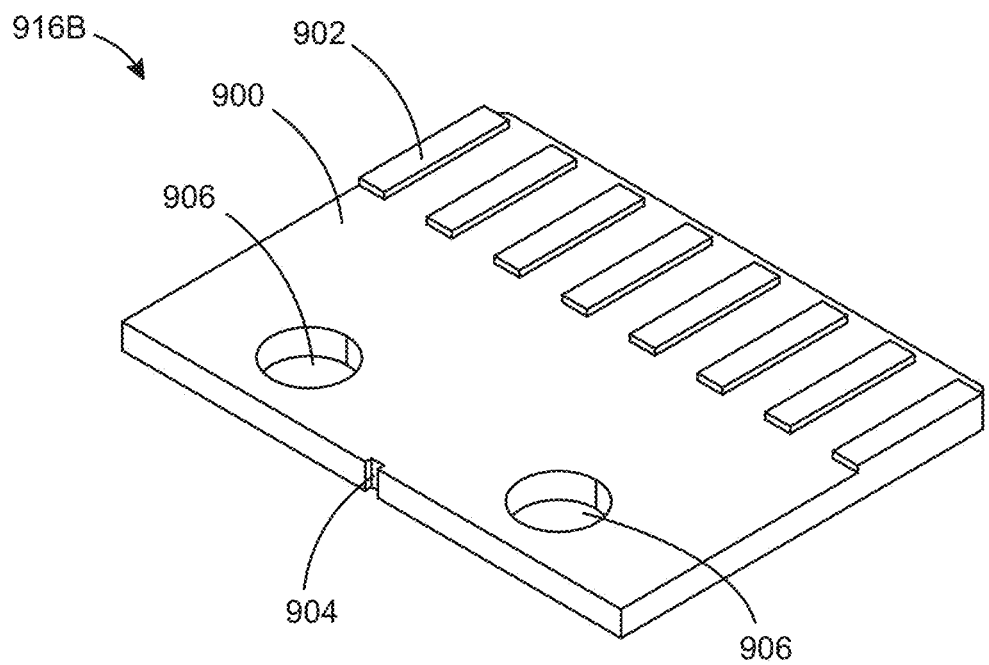
FIG. 9B shows a modified sample chip which is roughly half the size of the sample shown in FIG. 9A.

Referring to FIGS. 9A and 9B, exemplary sample chips 916A and 916B are shown which may be easily mounted to and dismounted from the above-described sample holder tip. Each sample may comprise a sample surface 900, one or more contacts 902, a sample window 904, one or more mounting facilities 906, and a lip 908. A sample may be prepared by welding or placing the sample on the sample surface 900. Although sample chip 916A may be used generally in TEM environments, sample chip 916B may be preferred for FIB sample analysis, in which the sample window 904 is usually positioned at the edge of the sample surface 900. Referring additionally back to FIG. 1A, once the sample chip 916A/B is placed within the platform 26, the cradle 14 may be translated X-ward toward the sample chip 916A/B in order to secure the sides of the sample chip 916A/B within the gap 512. Additionally referring to FIG. 3C, the contacts 902 may be in contact with the first convex bend 404 of their corresponding connecting wire 400. Additionally, each of the contacts 902 may be conductively coupled to one or more locations surrounding the sample window 904 via one or more metallic traces etched onto the sample surface 900 via microfabrication methods. Once the sample chip 916A/B is secured within the cradle 14, the cradle can be retracted and the sample chip 916A/B can be positioned over the circular opening 514.

Sample removal can be challenging for conventional sample holders. In the present invention, sample insertion is achieved by the concerted utilization of the extension/retraction mechanism, cradle design, and the connecting wire kinks and bends. However, sample removal from the sample holder tip during and after analysis are challenging using prior art techniques. To enable removal from the sample holder tip, the sample chip 916A/B may comprise one or more mounting facilities 906. In one embodiment, the sample chip 916A/B sample surface 900 may comprise a plurality of apertures (as shown) which can provide easy access for a forceps or other utensil to not only translate the sample chip 916A/B away (i.e., in an X-ward direction) from the cradle 14, but also to pull the sample chip 916A/B away (i.e., in a Z-ward direction) from the platform 26.

Figure 10A:
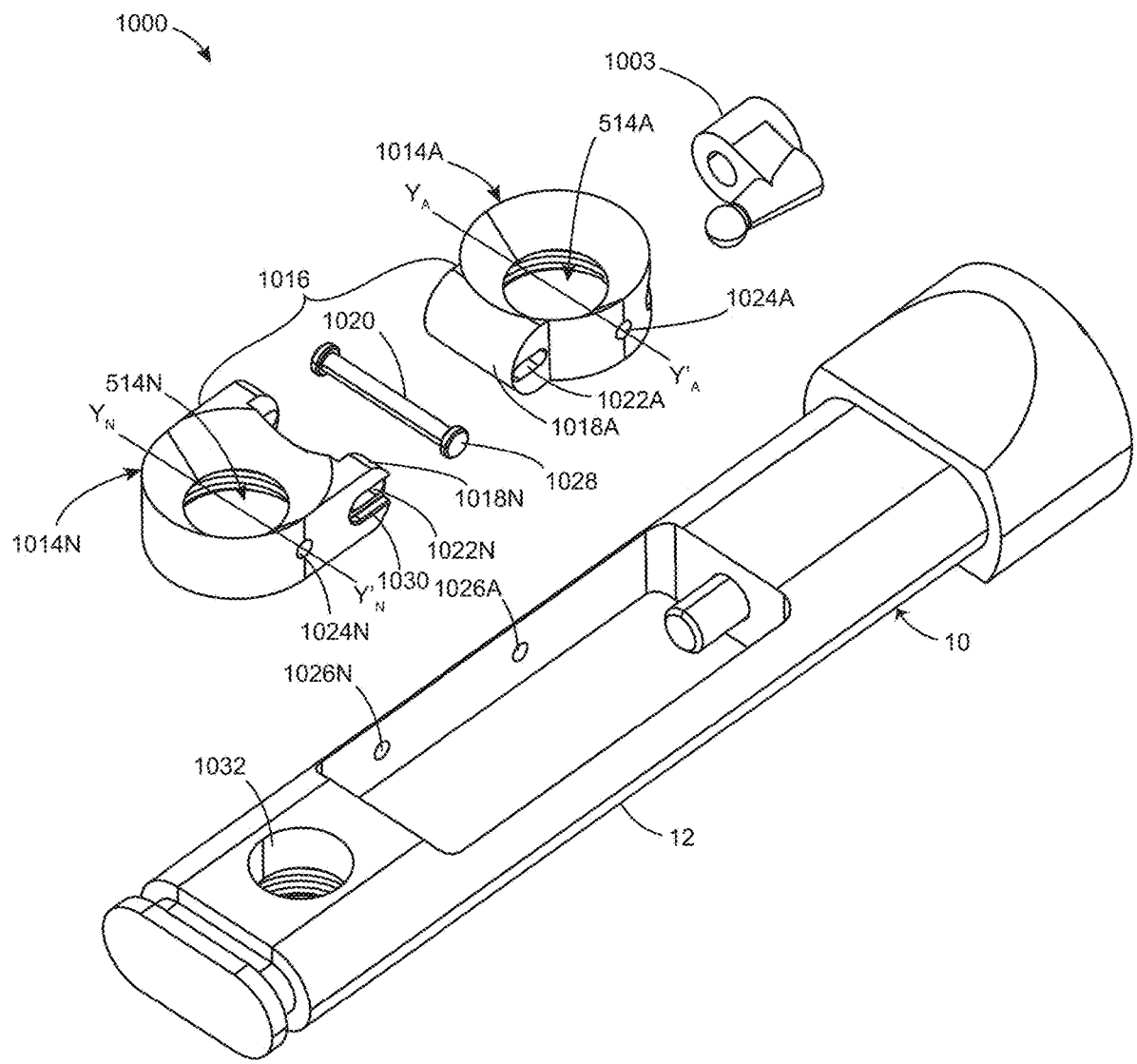
FIG. 10A shows an exploded left perspective view of an exemplary multi-tilting, multi-cradle assembly, according to one or more embodiments.
Figure 10B:
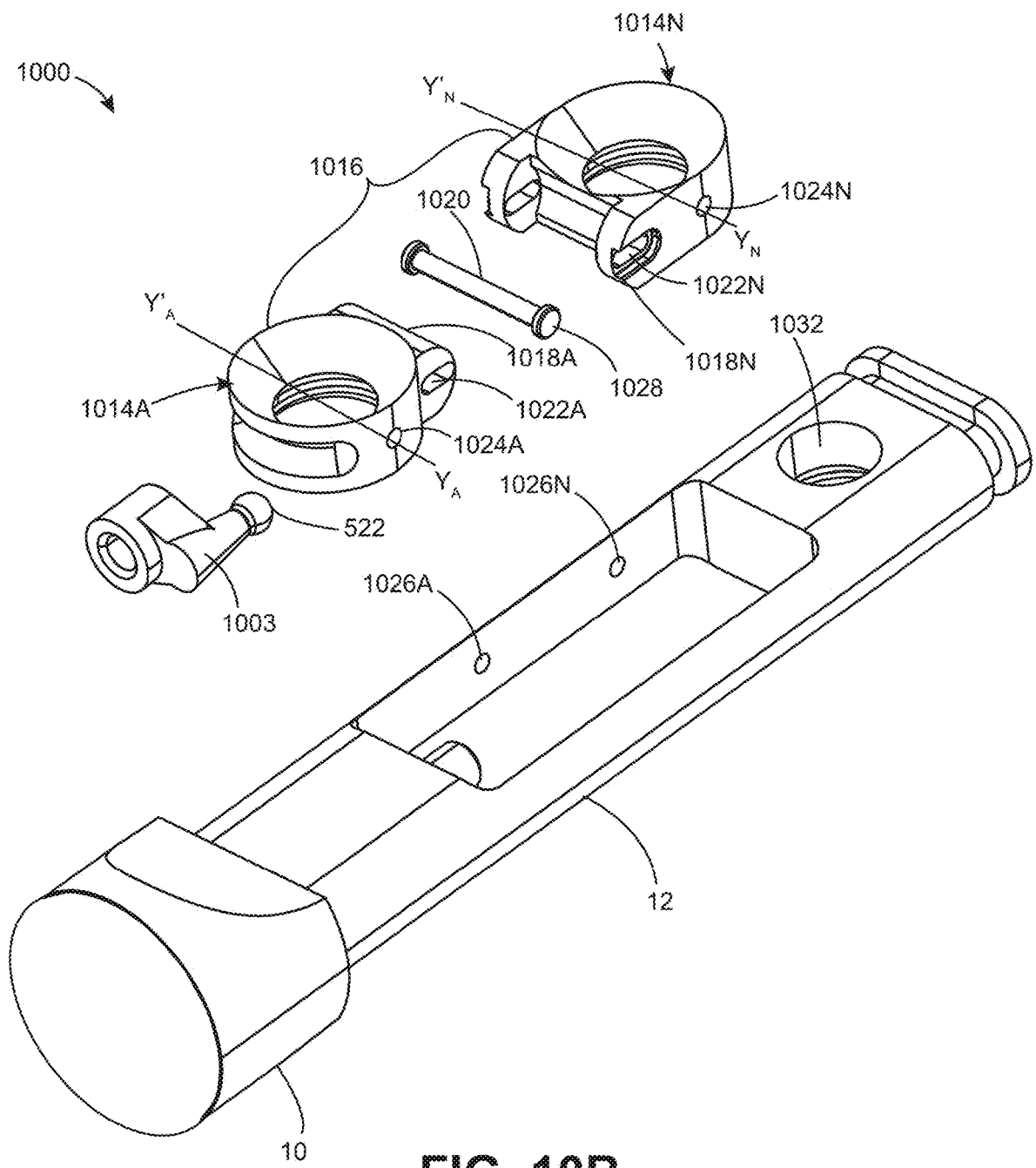
FIG. 10B shows an exploded right perspective view of an exemplary multi-tilting, multi-cradle assembly, according to one or more embodiments.

As shown in FIGS. 10A and 10B, a multi-cradle assembly 1000 comprising a plurality of tiltable cradles 1014A-N can be positioned within the sample holder tip 10. The cradles 1014A-N may be configured to allow each cradle to undergo positive or negative beta tilt without moving any of the cradles from their eucentric positions. Thus, multiple cradles can be accommodated within the sample holder tip, each consecutive cradle being coupled via a pivoting assembly. For example, a first cradle 1014A may be tilted by a tilt actuator 1003 and a pivoting assembly 1016 between the first cradle 1014A and a second cradle 1014N may allow a first tilt of the first cradle 1014A to be translated into an opposing second tilt of the second cradle 1014N. The exemplary pivoting assembly 1016 comprises a first union 1018A of the first cradle 1014A, a second union 1018N of the second cradle 1014N and a pin 1020. The first union 1018A may be a semicular prism protruding from the annular shape of the cradle 1014A and comprising a U-shaped aperture 1022 in which the pin 1020 may rest. The shape of the first union 1018A matches with that of the second union 1018N. For example, as shown in FIGS. 10A and 10B, the first union 1018A comprises a singular protruding portion which rests between opposing portions of the second union 1018N. The second union 1018N also comprises a similar opposing U-shaped aperture 1022 which aligns with that of the first union 1018A.

The cradles 1014A-N also each comprise lateral mounting points 1024A-N which may align with corresponding lateral mounting points 1026A-N of the frame. The physical shape of the opposing lateral mounts may be different across embodiments. For example, lateral mounting point 1024A may a spherical protrusion which aligns and fits within the lateral mounting point 1026A, which may be a corresponding spherical depression, or vice versa. Or, both lateral mounting points may be spherical depressions which contain a spherical bearing which allows the cradle to freely rotate. In any case, the lateral mounting points 1024-1026 allow rotation around each cradle's eucentric position (e.g., $Y_A$ to $Y'_A$, $Y_N$ to $Y'_N$).

Referring additionally to FIGS. 11A and 11B, side views are shown of the plurality of cradles in a tilted position (FIG. 11A) and in a horizontal position (FIG. 11B). As shown, cradle 1014A is in a negative beta tilt position and the cradle 1014N is in a positive beta tilt position. This configuration is made possible because the pin 1020 extends through the first union 1018A and the second union 1018N. Additionally, the pin 1020 comprises wings 1028 which rest within corresponding grooves 1030 on the outer lateral portions of the second union 1018N. The wings 1028 serve to guide the wings 1028 within the groove 1030 and the shaft of the pin 1020 within the overlapped U-shaped apertures 1022A-N. The U-shaped apertures 1022A-N allow enough space for the pin to sit relaxed and yet maintain the pivoting assembly 1016 between the cradles 1014A-N as they are tilted in opposing manners.

The compactness of the multi-cradle assembly 1000 is vital to the utility of the design. Allowing the cradles to essentially overlap provides a compact mechanism that opens up the space for further connected cradles or even a static reference cradle 1032.

It will be appreciated that the configurations disclosed herein are exemplary in nature, and that these specific embodiments are not to be considered in a limiting sense, because numerous variations are possible. For example, the above technology can be applied to several microscopy and spectroscopy techniques involving instruments such as transmission electron microscopy (TEM), scanning transmission electron microscope (STEM), scanning electron microscope (SEM) and also microscopes or spectroscopes outside the field of electron microscopy, for example instruments that use X-ray, visible light and infra-red light and ultraviolet light for imaging and spectroscopy. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A sample holder tip for transmission electron microscopy, comprising:
    a frame;
    a cradle rotatably coupled to the frame and comprising a sample stage;
    a connector assembly coupled to the cradle, the connector assembly comprising:
        a connector support element having a first portion positioned in relation to the sample stage so as to accommodate a portion of a prepared sample, and a second portion resting against the sample stage;
        a plurality of connecting wires, each of the connecting wires comprising one or more bends; and
    a tilt actuator coupled to the cradle for tilting the cradle.

2. The sample holder tip of claim 1, further comprising:
    a retraction barrel portion including a retraction shaft coupled to a shaft of the tilt actuator;
    wherein the cradle comprises a tilt actuator support portion through which the shaft of the tilt actuator extends;
    wherein the tilt actuator is coupled to the cradle via a linkage which converts a rotational motion of the retraction shaft to a tilt motion of the cradle.

3. The sample holder tip of claim 2 further comprising:
    an internal connector receiving a first end of the plurality of connecting wires;
        wherein the connector support element comprises a plurality of parallel channels corresponding to the plurality of connecting wires, each channel formed by a groove running from the second portion to the first portion and adjacent to at least one ridge,
        wherein each channel of the plurality of channels comprises an opening over the sample stage in the first portion,
        wherein a second end of each of the plurality of connecting wires extends through the corresponding openings of the plurality of channels.

4. The sample holder tip of claim 3, wherein the cradle comprises:
    one or more guides, each of the one or more guides having a pathway for accommodating a prepared sample substantially below the first portion of the connector support element.

5. The sample holder tip of claim 3, wherein the second end of each of the plurality of connecting wires comprises a first bend forming a connection portion positioned to contact the portion of the prepared sample.

6. The sample holder tip of claim 5, wherein the plurality of connecting wires comprise at least one pair of corresponding kinks creating a bent portion of each of the plurality of connecting wires which bend away from the tilt actuator to allow the tilt actuator to freely rotate.

7. The sample holder tip of claim 6, wherein the curvature of the bent portions is based on the shape of the retraction barrel.

8. The sample holder tip of claim 1, wherein the one or more connecting wire are made of a material with a high spring constant, such as Beryllium Copper.

\* \* \* \* \*